US009343570B2

(12) United States Patent
Yamazaki et al.

(10) Patent No.: US 9,343,570 B2
(45) Date of Patent: *May 17, 2016

(54) SEMICONDUCTOR DEVICE AND FABRICATION METHOD THEREOF

(71) Applicant: Semiconductor Energy Laboratory Co., Ltd., Kanagawa-ken (JP)

(72) Inventors: Shunpei Yamazaki, Tokyo (JP); Yasuyuki Arai, Kanagawa (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/510,503

(22) Filed: Oct. 9, 2014

(65) Prior Publication Data

US 2015/0091017 A1    Apr. 2, 2015

Related U.S. Application Data

(60) Continuation of application No. 14/021,168, filed on Sep. 9, 2013, now Pat. No. 8,859,353, which is a division of application No. 12/512,173, filed on Jul. 30, 2009, now Pat. No. 8,530,896, which is a division of application No. 10/871,621, filed on Jun. 18, 2004, now Pat. No. 7,569,854, which is a division of application No. 09/610,217, filed on Jul. 5, 2000, now Pat. No. 6,777,254.

(30) Foreign Application Priority Data

Jul. 6, 1999   (JP) .................................... 11-191093

(51) Int. Cl.
*H01L 29/78*    (2006.01)
*H01L 27/12*    (2006.01)

(52) U.S. Cl.
CPC .......... *H01L 29/7833* (2013.01); *G02F 1/1368* (2013.01); *G02F 1/13394* (2013.01); *G02F 1/13624* (2013.01); *G02F 1/133345* (2013.01); *G02F 1/136227* (2013.01); *G02F 1/136277* (2013.01); *G02F 1/136286* (2013.01); *H01L 27/12* (2013.01); *H01L 27/1214* (2013.01); *H01L 27/1248* (2013.01); *H01L 27/1251* (2013.01); *H01L 27/1288* (2013.01); *H01L 29/66742* (2013.01); *H01L 29/78672* (2013.01); *G02F 1/13454* (2013.01);

(Continued)

(58) Field of Classification Search
CPC .............. G02F 1/1339; G02F 1/13392; G02F 1/13394; H01L 27/3272; H01L 29/7833
See application file for complete search history.

(56) References Cited

U.S. PATENT DOCUMENTS

| 4,653,864 | A | 3/1987 | Baron et al. |
| 4,654,536 | A | 3/1987 | Saito et al. |

(Continued)

FOREIGN PATENT DOCUMENTS

| JP | 61-184518 A | 8/1986 |
| JP | 63-050817 A | 3/1988 |

(Continued)

*Primary Examiner* — Jose R Diaz
(74) *Attorney, Agent, or Firm* — Husch Blackwell LLP

(57) ABSTRACT

A p channel TFT of a driving circuit has a single drain structure and its n channel TFT, an LDD structure. A pixel TFT has the LDD structure. A pixel electrode disposed in a pixel unit is connected to the pixel TFT through a hole bored in at least a protective insulation film formed of an inorganic insulating material and formed above a gate electrode of the pixel TFT, and in an inter-layer insulation film disposed on the insulation film in close contact therewith. These process steps use 6 to 8 photo-masks.

19 Claims, 17 Drawing Sheets

(51) Int. Cl.

| | | |
|---|---|---|
| H01L 29/66 | (2006.01) | |
| G02F 1/1333 | (2006.01) | |
| G02F 1/1339 | (2006.01) | |
| G02F 1/1362 | (2006.01) | |
| G02F 1/1368 | (2006.01) | |
| H01L 29/786 | (2006.01) | |
| G02F 1/1345 | (2006.01) | |

(52) U.S. Cl.
CPC ............... *G02F 2001/13396* (2013.01); *G02F 2001/13398* (2013.01); *G02F 2001/136245* (2013.01); *Y10S 438/919* (2013.01)

(56) References Cited

U.S. PATENT DOCUMENTS

| | | | |
|---|---|---|---|
| 4,874,461 A | 10/1989 | Sato et al. | |
| 4,963,504 A | 10/1990 | Huang | |
| 4,975,385 A | 12/1990 | Beinglass et al. | |
| 5,003,356 A | 3/1991 | Wakai et al. | |
| 5,087,114 A * | 2/1992 | Fukui et al. | 349/157 |
| 5,153,754 A | 10/1992 | Whetten | |
| 5,182,619 A | 1/1993 | Pfiester | |
| 5,217,910 A | 6/1993 | Shimizu et al. | |
| 5,247,190 A | 9/1993 | Friend et al. | |
| 5,283,455 A | 2/1994 | Inoue et al. | |
| 5,302,966 A | 4/1994 | Stewart | |
| 5,323,042 A | 6/1994 | Matsumoto | |
| 5,338,240 A | 8/1994 | Kim | |
| 5,348,897 A | 9/1994 | Yen | |
| 5,377,031 A | 12/1994 | Vu et al. | |
| 5,379,139 A | 1/1995 | Sato et al. | |
| 5,399,502 A | 3/1995 | Friend et al. | |
| 5,403,772 A | 4/1995 | Zhang et al. | |
| 5,412,240 A | 5/1995 | Inoue et al. | |
| 5,412,494 A | 5/1995 | Ishiwata et al. | |
| 5,413,945 A | 5/1995 | Chien et al. | |
| 5,424,244 A | 6/1995 | Zhang et al. | |
| 5,482,871 A | 1/1996 | Pollack | |
| 5,499,123 A | 3/1996 | Mikoshiba | |
| 5,499,128 A | 3/1996 | Hasegawa et al. | |
| 5,508,209 A | 4/1996 | Zhang et al. | |
| 5,532,175 A | 7/1996 | Racanelli et al. | |
| 5,532,176 A | 7/1996 | Katada et al. | |
| 5,543,340 A | 8/1996 | Lee | |
| 5,543,947 A | 8/1996 | Mase et al. | |
| 5,563,427 A | 10/1996 | Yudasaka et al. | |
| 5,567,966 A | 10/1996 | Hwang | |
| 5,576,556 A | 11/1996 | Takemura et al. | |
| 5,576,887 A | 11/1996 | Ferrin et al. | |
| 5,576,926 A | 11/1996 | Monsorno | |
| 5,581,092 A | 12/1996 | Takemura | |
| 5,583,369 A | 12/1996 | Yamazaki et al. | |
| 5,583,675 A | 12/1996 | Yamada et al. | |
| 5,594,569 A | 1/1997 | Konuma et al. | |
| 5,608,251 A | 3/1997 | Konuma et al. | |
| 5,610,653 A | 3/1997 | Abecassis | |
| 5,616,506 A | 4/1997 | Takemura | |
| 5,623,157 A | 4/1997 | Miyazaki et al. | |
| 5,643,826 A | 7/1997 | Ohtani et al. | |
| 5,650,636 A | 7/1997 | Takemura et al. | |
| 5,672,523 A | 9/1997 | Yamamoto et al. | |
| 5,686,328 A | 11/1997 | Zhang et al. | |
| 5,691,793 A | 11/1997 | Watanabe et al. | |
| 5,706,064 A | 1/1998 | Fukunaga et al. | |
| 5,712,495 A | 1/1998 | Suzawa | |
| 5,739,890 A | 4/1998 | Uda et al. | |
| 5,757,451 A | 5/1998 | Miyazaki et al. | |
| 5,766,694 A | 6/1998 | West et al. | |
| 5,767,930 A | 6/1998 | Kobayashi et al. | |
| 5,773,330 A | 6/1998 | Park | |
| 5,804,878 A | 9/1998 | Miyazaki et al. | |
| 5,815,231 A | 9/1998 | Nishi et al. | |
| 5,815,232 A | 9/1998 | Miyazaki et al. | |
| 5,831,710 A | 11/1998 | Colgan et al. | |
| 5,834,327 A | 11/1998 | Yamazaki et al. | |
| 5,841,170 A | 11/1998 | Adan et al. | |
| 5,844,643 A | 12/1998 | Onishi et al. | |
| 5,849,043 A | 12/1998 | Zhang et al. | |
| 5,856,689 A | 1/1999 | Suzawa | |
| 5,858,820 A | 1/1999 | Jung et al. | |
| 5,879,977 A | 3/1999 | Zhang et al. | |
| 5,880,803 A | 3/1999 | Tamai et al. | |
| 5,903,249 A | 5/1999 | Koyama et al. | |
| 5,917,563 A | 6/1999 | Matsushima | |
| 5,917,572 A | 6/1999 | Kurauchi et al. | |
| 5,923,961 A | 7/1999 | Shibuya et al. | |
| 5,923,962 A | 7/1999 | Ohtani et al. | |
| 5,939,731 A | 8/1999 | Yamazaki et al. | |
| 5,946,561 A | 8/1999 | Yamazaki et al. | |
| 5,952,554 A | 9/1999 | Umeda | |
| 5,952,708 A | 9/1999 | Yamazaki | |
| 5,962,872 A | 10/1999 | Zhang et al. | |
| 5,966,193 A | 10/1999 | Zhang et al. | |
| 5,969,784 A | 10/1999 | Miyazaki et al. | |
| 5,978,061 A | 11/1999 | Miyazaki et al. | |
| 5,978,063 A | 11/1999 | Crawford et al. | |
| 5,982,002 A | 11/1999 | Takasu et al. | |
| 5,982,471 A | 11/1999 | Hirakata et al. | |
| 5,998,841 A | 12/1999 | Suzawa | |
| 6,031,290 A | 2/2000 | Miyazaki et al. | |
| 6,031,593 A * | 2/2000 | Morikawa | G02F 1/133512 349/110 |
| 6,034,748 A | 3/2000 | Furuta | |
| 6,049,370 A | 4/2000 | Smith et al. | |
| 6,055,034 A | 4/2000 | Zhang et al. | |
| 6,057,897 A | 5/2000 | Ichikawa et al. | |
| 6,066,860 A | 5/2000 | Katayama et al. | |
| 6,067,144 A | 5/2000 | Murouchi | |
| 6,096,585 A | 8/2000 | Fukuda et al. | |
| 6,097,467 A | 8/2000 | Fujimaki et al. | |
| 6,100,954 A | 8/2000 | Kim et al. | |
| 6,115,090 A | 9/2000 | Yamazaki | |
| 6,115,094 A | 9/2000 | Fukunaga | |
| 6,146,930 A | 11/2000 | Kobayashi et al. | |
| 6,147,667 A | 11/2000 | Yamazaki et al. | |
| 6,160,279 A | 12/2000 | Zhang et al. | |
| 6,163,357 A | 12/2000 | Nakamura | |
| 6,166,414 A | 12/2000 | Miyazaki et al. | |
| 6,177,974 B1 | 1/2001 | Hirakata et al. | |
| 6,198,133 B1 | 3/2001 | Yamazaki et al. | |
| 6,201,585 B1 | 3/2001 | Takano et al. | |
| 6,222,238 B1 | 4/2001 | Chang et al. | |
| 6,236,445 B1 | 5/2001 | Foschaar et al. | |
| 6,251,763 B1 | 6/2001 | Inumiya et al. | |
| 6,259,120 B1 | 7/2001 | Zhang et al. | |
| 6,259,138 B1 | 7/2001 | Ohtani et al. | |
| 6,271,543 B1 | 8/2001 | Ohtani et al. | |
| 6,278,131 B1 | 8/2001 | Yamazaki et al. | |
| 6,281,552 B1 | 8/2001 | Kawasaki et al. | |
| 6,286,359 B1 | 9/2001 | Umeda | |
| 6,287,733 B1 | 9/2001 | Miyazaki et al. | |
| 6,287,951 B1 | 9/2001 | Lucas et al. | |
| 6,288,764 B1 * | 9/2001 | Zhang et al. | 349/152 |
| 6,306,694 B1 | 10/2001 | Yamazaki et al. | |
| 6,316,787 B1 | 11/2001 | Ohtani | |
| 6,358,766 B1 | 3/2002 | Kasahara | |
| 6,399,988 B1 | 6/2002 | Yamazaki | |
| 6,400,434 B1 | 6/2002 | Fukunaga | |
| 6,404,480 B2 | 6/2002 | Hirakata et al. | |
| 6,445,059 B1 | 9/2002 | Yamazaki | |
| 6,445,437 B1 | 9/2002 | Miyazaki et al. | |
| 6,492,659 B1 | 12/2002 | Yamazaki et al. | |
| 6,524,895 B2 | 2/2003 | Yamazaki et al. | |
| 6,534,826 B2 | 3/2003 | Yamazaki | |
| 6,541,294 B1 | 4/2003 | Yamazaki et al. | |
| 6,576,924 B1 | 6/2003 | Yamazaki et al. | |
| 6,576,926 B1 | 6/2003 | Yamazaki et al. | |
| 6,613,620 B2 | 9/2003 | Fujimoto et al. | |
| 6,617,644 B1 | 9/2003 | Yamazaki et al. | |
| 6,638,781 B1 | 10/2003 | Hirakata et al. | |
| 6,657,228 B2 | 12/2003 | Ohtani | |
| 6,661,096 B1 | 12/2003 | Takayama et al. | |
| 6,664,145 B1 | 12/2003 | Yamazaki et al. | |

(56) References Cited

U.S. PATENT DOCUMENTS

| | | | |
|---|---|---|---|
| 6,730,550 B1 | 5/2004 | Yamazaki et al. |
| 6,743,649 B2 | 6/2004 | Yamazaki et al. |
| 6,753,212 B2 | 6/2004 | Yamazaki et al. |
| 6,753,257 B2 | 6/2004 | Yamazaki |
| 6,762,081 B2 | 7/2004 | Yamazaki et al. |
| 6,777,254 B1 | 8/2004 | Yamazaki et al. |
| 6,777,716 B1 | 8/2004 | Kitakado et al. |
| 6,784,457 B2 | 8/2004 | Yamazaki et al. |
| 6,888,608 B2 | 5/2005 | Miyazaki et al. |
| 6,914,642 B2 | 7/2005 | Yamazaki et al. |
| 6,927,109 B1 | 8/2005 | Tanaka et al. |
| 6,936,844 B1 | 8/2005 | Yamazaki et al. |
| 6,952,020 B1 | 10/2005 | Yamazaki et al. |
| 6,972,435 B2 | 12/2005 | Ohtani |
| 6,974,731 B2 | 12/2005 | Yamazaki et al. |
| 6,979,841 B2 | 12/2005 | Ohtani |
| 6,992,328 B2 | 1/2006 | Yamazaki et al. |
| 7,015,141 B2 | 3/2006 | Yamazaki |
| 7,071,041 B2 | 7/2006 | Yamazaki et al. |
| 7,173,281 B2 | 2/2007 | Hirakata et al. |
| 7,176,993 B2 | 2/2007 | Fukunaga |
| 7,179,698 B2 | 2/2007 | Yamazaki et al. |
| 7,226,822 B2 | 6/2007 | Takayama et al. |
| 7,245,018 B1 | 7/2007 | Takayama et al. |
| 7,259,427 B2 | 8/2007 | Yamazaki et al. |
| 7,279,711 B1 | 10/2007 | Yamazaki et al. |
| 7,330,234 B2 | 2/2008 | Murakami et al. |
| 7,335,911 B2 | 2/2008 | Yamazaki et al. |
| 7,348,599 B2 | 3/2008 | Yamazaki et al. |
| 7,414,288 B2 | 8/2008 | Ohtani |
| 7,419,861 B2 | 9/2008 | Tanaka et al. |
| 7,561,242 B2 | 7/2009 | Hirakata et al. |
| 7,569,854 B2 | 8/2009 | Yamazaki et al. |
| 7,573,069 B2 | 8/2009 | Yamazaki |
| 7,605,902 B2 | 10/2009 | Hirakata et al. |
| 7,667,817 B2 | 2/2010 | Zhang et al. |
| 7,737,441 B2 | 6/2010 | Yamazaki et al. |
| 7,760,316 B2 | 7/2010 | Hirakata et al. |
| 7,816,191 B2 | 10/2010 | Takayama et al. |
| 7,858,987 B2 | 12/2010 | Yamazaki |
| 7,906,429 B2 | 3/2011 | Takayama et al. |
| 7,923,779 B2 | 4/2011 | Yamazaki et al. |
| 7,968,890 B2 | 6/2011 | Yamazaki et al. |
| 8,045,125 B2 | 10/2011 | Hirakata et al. |
| 8,071,981 B2 | 12/2011 | Yamazaki et al. |
| 8,097,884 B2 | 1/2012 | Yamazaki |
| 8,664,660 B2 * | 3/2014 | Yamazaki et al. ............ 257/59 |
| 2002/0163000 A1 | 11/2002 | Yamazaki |
| 2002/0171800 A1 | 11/2002 | Miyazaki et al. |
| 2004/0218112 A1 | 11/2004 | Hirakata et al. |
| 2004/0238820 A1 | 12/2004 | Sakama et al. |
| 2006/0220021 A1 | 10/2006 | Yamazaki et al. |
| 2007/0085964 A1 | 4/2007 | Zhang et al. |
| 2007/0148925 A1 | 6/2007 | Yamazaki et al. |
| 2007/0205413 A1 | 9/2007 | Yamazaki et al. |
| 2008/0048189 A1 | 2/2008 | Yamazaki et al. |
| 2008/0290345 A1 | 11/2008 | Ohtani |
| 2011/0223699 A1 | 9/2011 | Takayama et al. |
| 2011/0241012 A1 | 10/2011 | Yamazaki et al. |
| 2011/0254008 A1 | 10/2011 | Suzawa et al. |
| 2012/0044433 A1 | 2/2012 | Hirakata et al. |
| 2012/0120336 A1 | 5/2012 | Hirakata et al. |

FOREIGN PATENT DOCUMENTS

| | | |
|---|---|---|
| JP | 05-281558 A | 10/1993 |
| JP | 05-289109 A | 11/1993 |
| JP | 06-051319 A | 2/1994 |
| JP | 06-244104 A | 9/1994 |
| JP | 06-265912 A | 9/1994 |
| JP | 06-273735 A | 9/1994 |
| JP | 07-084267 A | 3/1995 |
| JP | 07-130652 A | 5/1995 |
| JP | 08-248427 A | 9/1996 |
| JP | 09-073093 A | 3/1997 |
| JP | 09-120062 A | 5/1997 |
| JP | 09-197413 A | 7/1997 |
| JP | 10-056184 A | 2/1998 |
| JP | 10-068955 A | 3/1998 |
| JP | 10-153797 A | 6/1998 |
| JP | 10-221717 A | 8/1998 |
| JP | 10-228022 A | 8/1998 |
| JP | 10-319431 A | 12/1998 |
| JP | 10-319440 A | 12/1998 |

* cited by examiner

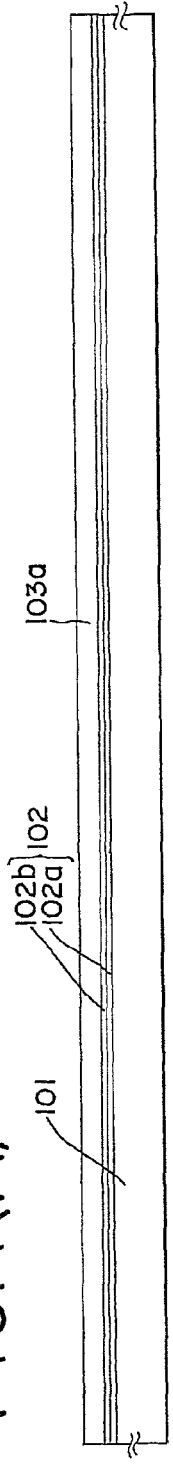
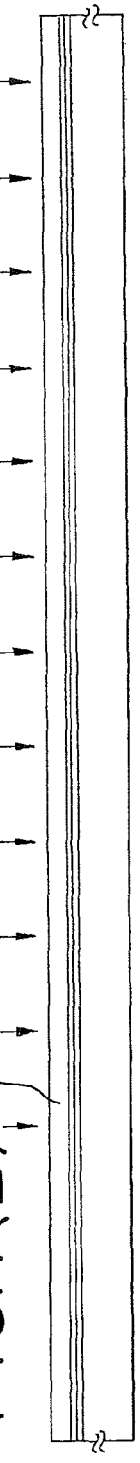
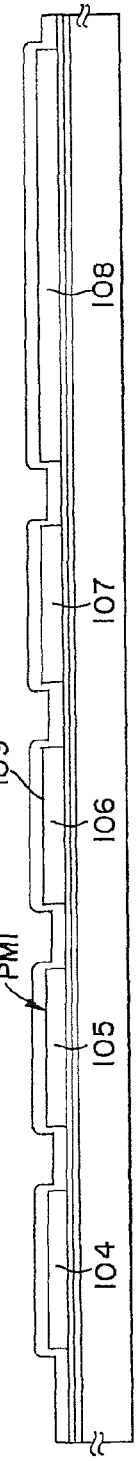
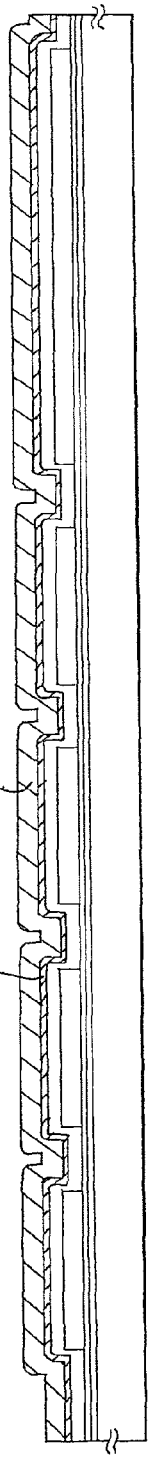
FIG. 1(A) FORMATION OF UNDERLYING FILM/AMORPHOUS SEMICONDUCTOR FILM
FIG. 1(B) CRYSTALLIZATION STEP
FIG. 1(C) FORMATION OF ISLAND SHAPE SEMICONDUCTOR LAYER/GATE INSULATION FILM
FIG. 1(D) FORMATION OF HEAT-RESISTANT CONDUCTOR LAYER

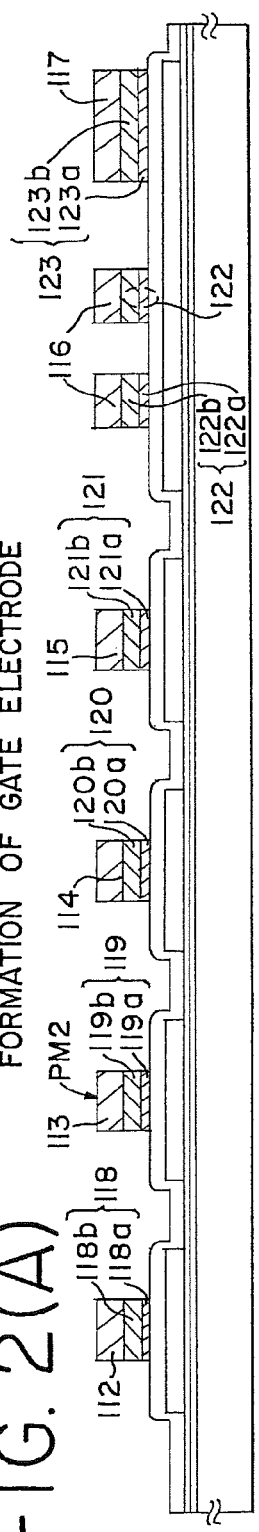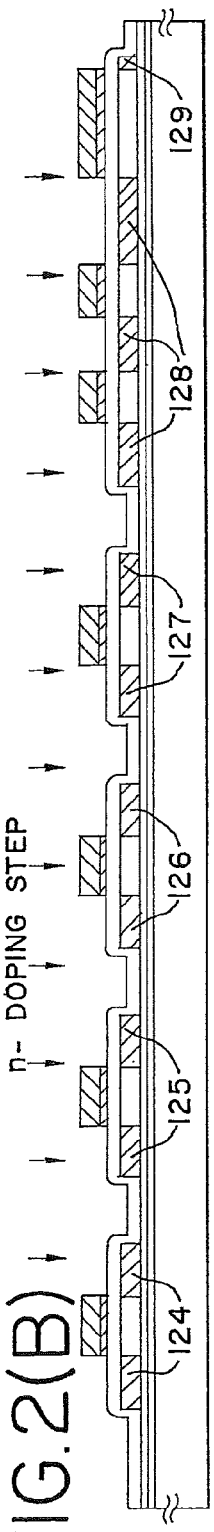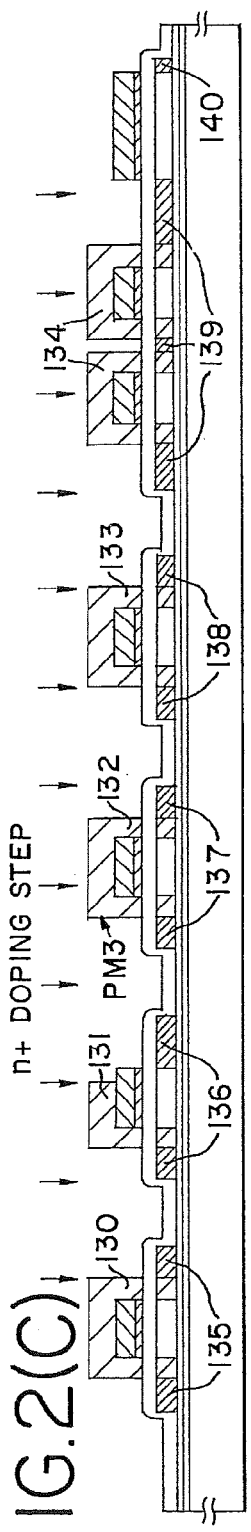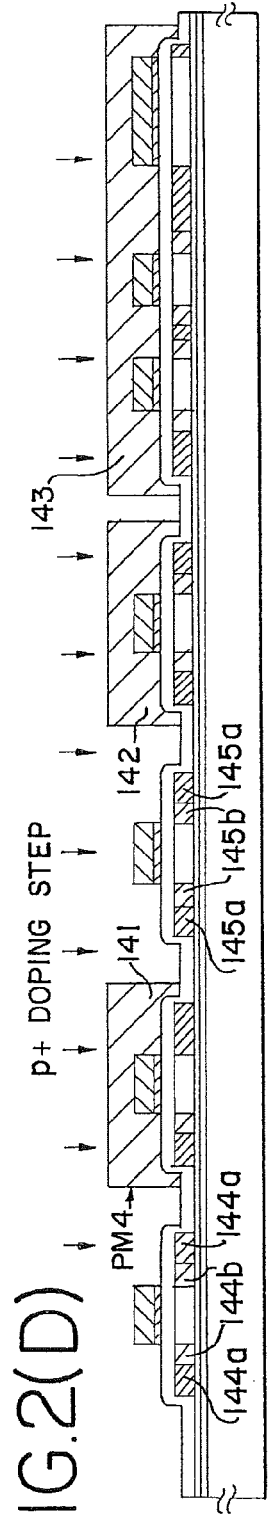

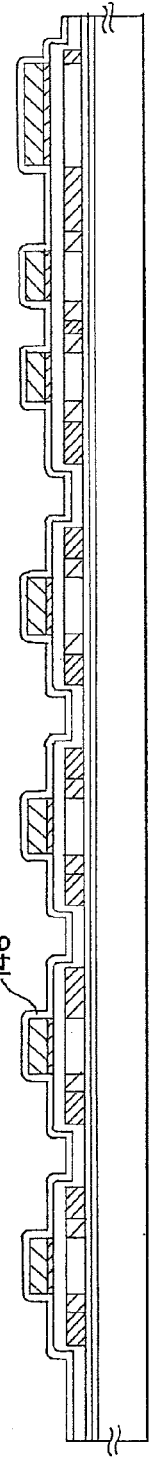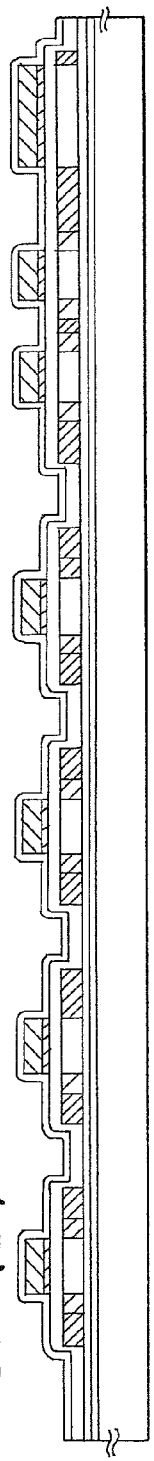
FIG.3(A) FORMATION OF PROTECTIVE INSULATION FILM
FIG.3(B) ACTIVATION STEP
FIG.3(C) FORMATION OF RESIN INTER-LAYER INSULATION FILM / PERFORATION OF CONTACT HOLE / FORMATION OF LEAD WIRE AND PIXEL ELECTRODE

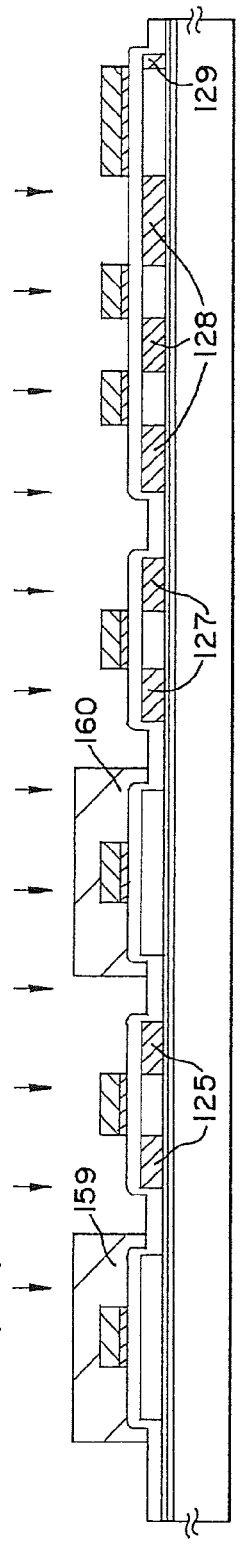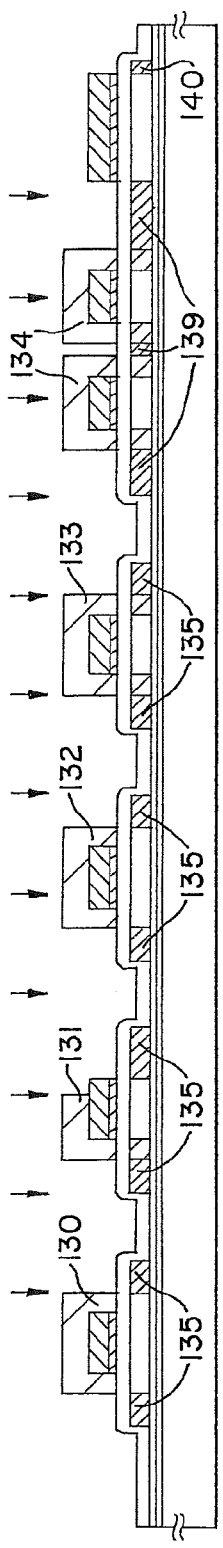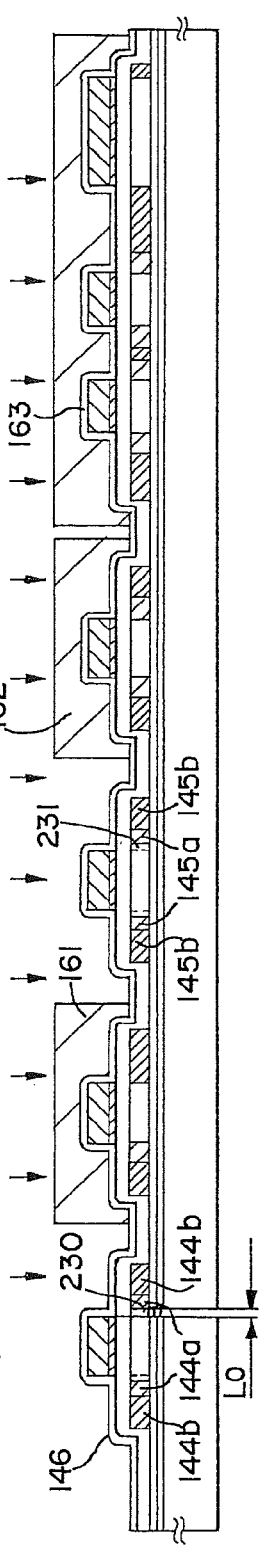

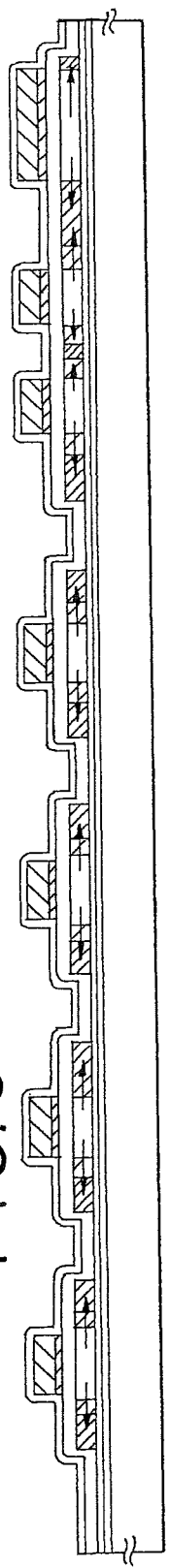
FIG. 9 ACTIVATION
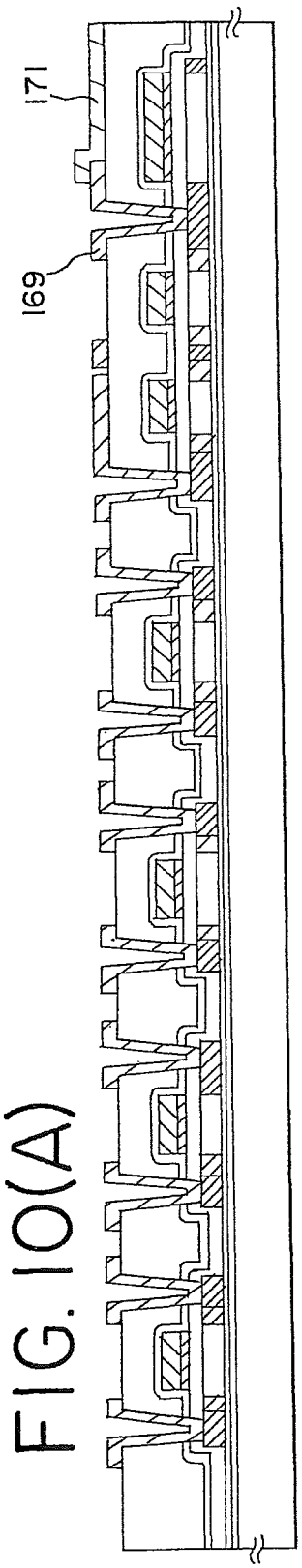
FIG. 10(A)
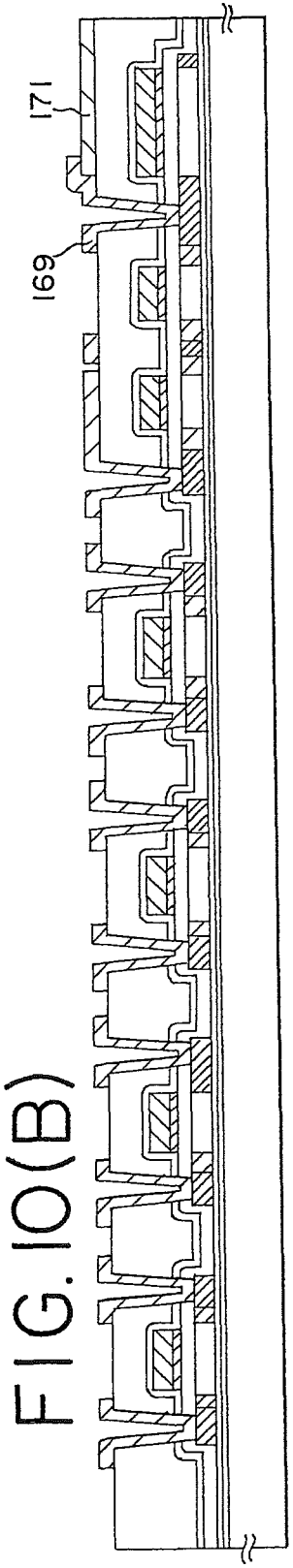
FIG. 10(B)

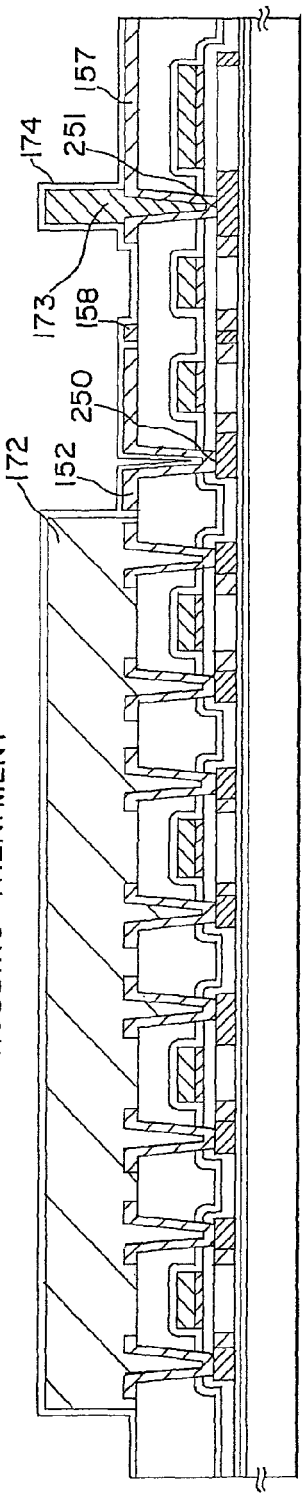

SECTIONAL TYPICAL VIEW OF SPACER

APPEARANCE VIEW AND SECTIONAL VIEW OF PORTABLE INFORMATION TERMINAL (OPTICAL TOUCH PANEL)

SECTIONAL VIEW OF PIXEL UNIT

LIGHT SOURCE OPTICAL SYSTEM
AND DISPLAY DEVICE
(THREE PLATE TYPE)

LIGHT SOURCE
OPTICAL SYSTEM

SEMICONDUCTOR DEVICE AND FABRICATION METHOD THEREOF

This application is a divisional of U.S. application Ser. No. 14/021,168 filed Sep. 9, 2013 which is a divisional of U.S. application Ser. No. 12/512,173 filed Jul. 30, 2009 (now U.S. Pat. No. 8,530,896 issued Sep. 10, 2013) which is a divisional of U.S. application Ser. No. 10/871,621 filed Jun. 18, 2004 (now U.S. Pat. No. 7,569,854 issued Aug. 4, 2009) which is a divisional of U.S. application Ser. No. 09/610,217 filed Jul. 5, 2000 (now U.S. Pat. No. 6,777,254 issued Aug. 17, 2004), all of which are incorporated herein by reference.

BACKGROUND OF THE INVENTION

1. Field of the Invention

This invention relates to a semiconductor device having a circuit comprising thin film transistors (hereinafter called "TFT") on a substrate having an insulation surface, and a fabrication method thereof. More particularly, the present invention provides a technology that will be utilized advantageously for an electro-optical device typified by a liquid crystal display device having a pixel unit and a driving circuit disposed round the pixel unit, and for an electronic appliance having such an electro-optical device mounted thereto. Incidentally, the term "semiconductor device" used herein represents those devices which operate by utilizing semiconductor characteristics, and embraces within its scope the electro-optical devices as well as the electronic appliances having the electro-optical device mounted thereto that are described above.

2. Description of the Related Art

A technology that uses TFTs for constituting switching devices and functional circuits has been developed in the electro-optical device typified by an active matrix type liquid crystal display device. In the TFT, a semiconductor film is grown on a substrate such as a sheet of glass by a vapor phase growing method, and the semiconductor film is used as an active layer. Silicon or a material consisting of silicon as the principal component such as silicon-germanium has been used appropriately for the semiconductor film. An amorphous silicon film and a crystalline silicon film represented by a polycrystalline silicon film can be obtained depending on the formation method of the silicon semiconductor film.

The TFT using the amorphous silicon film for the active layer cannot essentially acquire field effect mobility of greater than several $cm^2/Vsec$ because of its electro-physical factors resulting from the amorphous structure, and so forth. Therefore, though it can be used as a switching device (pixel TFT) for driving a liquid crystal disposed at each pixel of a pixel unit in an active matrix type liquid crystal device, the amorphous silicon film cannot form a driving circuit for effecting image display. For this reason, a technology of packaging a driver IC, etc, by using a TAB (Tape Automated Bonding) system or a COG (Chip on Glass) system has been employed.

On the other hand, the TFT using the crystalline silicon film for the active layer can acquire high field effect mobility and can form various functional circuits on the same glass substrate. The crystalline silicon film makes it possible to fabricate a shift register circuit, a level shifter circuit, a buffer circuit, a sampling circuit, and the like, each comprising a CMOS circuit including n channel TFTs and p channel TFTs in the driving circuit besides the pixel TFTs. To achieve the reduction of weight and thickness in the liquid crystal display device on the basis of such a technology, it has proved clear that the TFT using the crystalline semiconductor film, that can form integrally the driving circuit on the same substrate besides the pixel unit, for the active layer is suitable.

From the aspect of performance of the TFT, the active layer using the crystalline silicon film is superior. To form the TFT that can cope with various circuits besides the pixel TFTs, however, the fabrication steps become complicated and the number of process steps increases. The increase of the number of process steps in turn results in the increase of the production cost and lowers also the production yield.

For example, the operating condition of the circuits are not always the same for the pixel TFT and the TFT of the driving circuit. Therefore, the characteristics required for each TFT are different. The pixel TFT comprises an n channel TFT, applies the voltage and drives a liquid crystal as a switching device. Since the liquid crystal is driven by the alternating current, a system called "frame inversion driving" has been used widely. To limit power consumption to a low leveling this system, one of the characteristics required for the pixel TFT is to restrict an OFF current value (a drain current that flows when the TFT is under the OFF operation) to a sufficiently low level. On the other hand, a high driving voltage is applied to a buffer circuit of a control circuit. Therefore, the withstand voltage must be increased less the TFT is not broken even when a high voltage is applied thereto. To improve a current driving capacity, a sufficient ON current value (the drain current that flows when the TFT is under the ON operation) must be secured.

A lightly doped drain (LDD) structure is known as a TFT structure for reducing the OFF current value. This structure disposes an impurity region, to which an impurity element is added in a concentration lower than that of a source or drain region, between a channel formation region and the source or drain region that is formed by adding an impurity element in a high concentration. This impurity region is called the "LDD region".

As described above, the required characteristics are not always the same between the pixel TFT and the TFT used for the driving circuit such as the shift register circuit or the buffer circuit. For example, a large back-bias (a negative voltage in the case of the n channel TFT) to the gate of the pixel TFT, but the TFT of the driving circuit does not basically operate under the back-bias state. As to the operation speed, too, the operation speed of the pixel TFT may not be higher than $\frac{1}{100}$ of that of the TFT of the control circuit.

To stabilize the operation of these circuit fabricated by using the n- and p-channel TFTs, the threshold voltage and sub-threshold coefficient (S value) of the TFTs must be kept within predetermined ranges. For this purpose, the TFT must be examined from the aspects of both structure and material.

SUMMARY OF THE INVENTION

The present invention contemplates to provide a technology that solves these problems. In electro-optical devices typified by an active matrix liquid crystal device fabricated by using TFTs, the present invention is directed to improve the operation characteristics and reliability of the semiconductor devices by optimizing the structures of the TFTs employed in various circuits in accordance with the functions of the respective circuits, to lower power consumption, and the production cost by reducing the number of process steps, and to improve the production yield.

To accomplish the reduction of the production cost and the improvement of the production yield by reducing the number of process steps, the number of photo-masks used for the fabrication of the TFT must be reduced. In photolithography, the photo-mask is used for forming a resist pattern as the mask for the etching process on the substrate. Therefore, when one photo-mask is used, additional process steps such as peeling, washing, drying, etc, of the resist are necessary before and after the etching step in addition to the process steps of the film formation and etching. In the photolithography step, too, complicated process steps such as the application of the resist, pre-baking, exposure, development, post-baking, etc, are necessary.

To accomplish the object described above, the present invention provides a semiconductor device having, on the same substrate, pixel TFTs disposed in a pixel unit and a driving circuit including p channel type TFTs and n channel type TFTs and disposed round the pixel unit, wherein the p channel type TFT of the driving circuit has a channel formation region and a p type impurity region having a third concentration, for forming a source region or a drain region; the n channel type TFT of the driving circuit and the pixel TFT each have a channel formation region, an n type impurity region having a first concentration, disposed in contact with the channel formation region and forming an LDD region, and an n type impurity region for forming a source region or a drain region, having a second concentration and disposed outside the n type impurity region having the first concentration; and each pixel electrode disposed in the pixel unit and having a light reflecting surface is formed on an inter-layer insulation film made of an organic insulating material, and is connected to the pixel TFT through a hole bored in at least a protective insulation film made of an inorganic insulating material and disposed above a gate electrode of said pixel TFT and said inter-layer insulation film formed on the insulation film in close contact therewith.

Another construction of the present invention provides a semiconductor device having, on the same substrate, pixel TFTs disposed in a pixel unit and a driving circuit including p channel type TFTs and n channel type TFTs and disposed round the pixel unit, wherein: the p channel type TFT of the driving circuit has a channel formation region and a p type impurity region having a third concentration, for forming a source region or a drain region; the n channel type TFT of the driving circuit and the pixel TFT each have a channel formation region, an n type impurity region having a first concentration, disposed in contact with the channel formation region and forming an LDD region, and an n type impurity region for forming a source region or a drain region, having a second concentration and disposed outside the n type impurity region having the first concentration; and each pixel electrode disposed in the pixel unit and having a light reflecting surface is formed on an inter-layer insulation film made of an organic insulating material, and is connected to an electrically conductive lead wire connected to the pixel TFT, through a hole bored in at least a protective insulation film made of an inorganic insulating material and disposed above a gate electrode of said pixel TFT and said inter-layer insulation film formed on the protective insulation film in close contact therewith.

Another construction of the present invention provides a semiconductor device having a liquid crystal sandwiched between a pair of substrates, wherein, in one of said substrates having pixel TFT of a pixel unit and p channel type TFTs and n channel type TFTs of a driving circuit; the p channel type TFT of the driving circuit has a channel formation region and a p type impurity region having a third concentration, for forming a source region or a drain region; the n channel type TFT of said driving circuit and the pixel TFT each have a channel formation region, an n type impurity region having a first concentration, disposed in contact with the channel formation region and forming an LDD region, and an n type impurity region for forming a source region or a drain region, having a second concentration and disposed outside said n type impurity region having the first concentration; each pixel electrode disposed in the pixel unit and having a light reflecting surface is formed on an inter-layer insulation film made of an organic insulating material and is connected to said pixel TFT through a hole bored in at least a protective insulation film made of an inorganic insulating material and disposed above a gate electrode of the pixel TFT and said inter-layer insulation film formed on the protective insulation film in close contact therewith; and this one substrate is bonded to the other substrate having a transparent conductor film formed thereon through at least one columnar spacer formed in superposition with the hole.

Another construction of the present invention provides a semiconductor device having a liquid crystal sandwiched between a pair of substrates, wherein, in one of the substrates having pixel TFTs of a pixel unit and p channel type TFTs and n channel type TFTs of a driving circuit; the p channel type TFT of the driving circuit has a channel formation region and a p type impurity region having a third concentration, for forming a source region or a drain region; the n channel type TFT of the driving circuit and the pixel TFT each have a channel formation region, an n type impurity region having a first concentration, disposed in contact with the channel formation region and forming an LDD region, and an n type impurity region for forming a source region or a drain region, having a second concentration and disposed outside the n type impurity region having the first concentration; each pixel electrode disposed in the pixel unit and having a light transmitting property is formed on an inter-layer insulation film made of an organic insulating material and is connected to a conductive metal lead wire connected to the pixel TFT through a hole bored in at least a protective insulation film made of an inorganic insulating material and disposed above a gate electrode and said inter-layer insulation film formed on the protective insulation film in close contact therewith; and this one substrate is bonded to the other of the substrates having a transparent conductor formed thereon through at least one columnar spacer formed in superposition with the hole.

In the present invention, the p channel type TFT of the driving circuit has an offset region formed between the channel formation region and the p type impurity region having the third concentration, for forming the source region or the drain region.

In a method of fabricating a semiconductor device having, on the same substrate, pixel TFTs disposed in a pixel unit and a driving circuit including p channel type TFTs and n channel type TFTs and disposed round said pixel unit, a method of fabricating a semiconductor device according to the present invention comprises the steps of: forming an underlying film on the substrate; forming a plurality of island-like semiconductor layers on the underlying film; forming an n type impurity region having a first concentration, for forming an LDD region of the n channel type TFT of the driving circuit and the pixel TFT in a selected region of the island-like semiconductor layer; forming an n type impurity region having a second concentration, for forming a source region or a drain region outside the n type impurity region having the first concentration; forming a p type impurity region having a third concentration, for forming a source region or a drain region of the p channel type TFT of the driving circuit in a selected region of the island-like semiconductor layer; forming a protective insulation film formed of an inorganic insulating material above the n channel type TFT of the driving circuit, the pixel TFT and the p channel type TFT; forming an inter-layer insulation film formed of an organic insulating material in close contact with the protective insulation film; and forming a pixel electrode having a light reflecting surface and connected to the pixel TFT on the inter-layer insulating film.

In a method of fabricating a semiconductor device having, on the same substrate, pixel TFTs disposed in a pixel unit and a driving circuit including p channel type TFTs and n channel type TFTs and disposed round the pixel unit, the present invention provides a method of fabricating a semiconductor device that comprises the steps of: forming an underlying film on the substrate; forming a plurality of island-like semiconductor layers on the underlying film; forming an n type impurity region having a first concentration, for forming an LDD region of the n channel type TFT of the driving circuit and the pixel TFT in a selected region of the island-like semiconductor layer; forming a high concentration n type impurity region for forming a source region or a drain region outside the n type impurity region having the first concentration; forming a p type impurity region having a third concentration, for forming a source region or a drain region of the p channel type TFT of the driving circuit in a selected region of the island-like semiconductor layers; forming a protective insulation film formed of an inorganic insulating material above the n channel type TFT of the driving circuit, the pixel TFT and the p channel type TFT; forming an inter-layer insulation film formed of an organic insulating material in close contact with the protective insulation film; forming a conductive metal lead wires to be connected to the pixel TFT; and forming a pixel electrode comprising a transparent conductor film to be connected to the conductive metal lead wires, on the inter-layer insulation film.

In a method of fabricating a semiconductor device having a liquid crystal sandwiched between a pair of substrates, the present invention provides a method of fabricating a semiconductor device that comprises the following steps for one of substrates including pixel TFTs disposed in a pixel unit and a driving circuit having p channel type TFTs and n channel type TFTs round the pixel unit: forming an underlying film on the substrate; forming a plurality of island-like semiconductor layer on the underlying film; forming an n type impurity region having a first concentration, for forming an LDD region of the n channel type TFT of the driving circuit and the pixel TFT, in a selected region of the island-like semiconductor layers; forming an n type impurity region having a second concentration, for forming a source region or a drain region outside the n type impurity region having the first concentration; forming a p type impurity region having a third concentration, for forming a source region or a drain region of the p channel type TFT of said driving circuit, in a selected region of the island-like semiconductor layer; forming a protective insulation film formed of an inorganic insulating material above the gate electrodes of the n channel type TFT of the driving circuit, the pixel TFT and the p channel type TFT; forming an inter-layer insulating film formed of an organic insulating material in close contact with the protective insulation film; and forming a pixel electrode having a light reflecting surface and to be connected to the pixel TFT through a hole bored in the inter-layer insulation film and in the protective insulation film, on the inter-layer insulation film: and comprises, as for the other of the substrates, the step of forming at least a transparent conductor film; the method further comprising the step of bonding the one substrate to the other substrate through at least one columnar spacer formed in superposition with the hole.

In a method of fabricating a semiconductor device having a liquid crystal sandwiched between a pair of substrates, the present invention provides a method of fabricating a semiconductor device that comprises the following steps for one of substrates having pixel TFTs disposed in a pixel unit and a driving circuit having p channel type TFTs and n channel type TFTs and disposed round the pixel unit; forming an underlying film on the substrate; forming a plurality of island-like semiconductor layers on the underlying film; forming an n type impurity region having a first concentration, for forming an LDD region of the n channel type TFT and the pixel TFT, in a selected region of the island-like semiconductor layer; forming an n type impurity region having a second concentration, for forming a source region or a drain region outside the n type impurity region having the first concentration; forming a p type impurity region having a third concentration, for forming a source region or a drain region of the p channel type TFT of the driving circuit, in a selected region of the island-like semiconductor layer; forming a protective insulation film formed of an inorganic insulating material above the n channel type TFT of the driving circuit, the pixel TFT and the p channel type TFT; forming an inter-layer insulation film formed of an organic insulating material in close contact with the protective insulation film; forming a conductive metal lead wire connected to the pixel TFT, through a hole bored in the inter-layer insulation film and the protective insulation film; and forming a pixel electrode comprising a transparent conductor film to be connected to the metal lead wire, on the inter-layer insulation film; and comprises, as for the other of the substrates, the step of forming at least a transparent conductor film on the other of the substrates; the method further comprising the step of bonding the one substrate to the other substrate through at least one columnar spacer formed in superposition with the hole.

In the method of fabricating a semiconductor device described above, as for the p channel type TFT of the driving circuit, the step of forming a p type impurity region having a third concentration, for forming a source region or a drain region of the p channel type TFT can be conducted in a selected region of the island-like semiconductor layers after the step of forming the protective insulation film formed of an inorganic insulating material, on the gate electrode of the p channel type TFT, and an offset region can be formed between the channel formation region of the p channel type TFT and the p type impurity region having the third concentration, for forming the source region or the drain region.

BRIEF DESCRIPTION OF THE DRAWINGS

FIGS. 1(A) to 1(D) are sectional views showing a fabrication step of a pixel TFT and a TFT of a driving circuit;

FIGS. 2(A) to 2(D) are sectional views showing a fabrication step of the pixel TFT and the TFT of the driving circuit;

FIGS. 3(A) to 3(C) are sectional views showing a fabrication step of the pixel TFT and the TFT of the driving circuit;

FIGS. 4(A) to 4(C) are sectional views showing a fabrication step of the pixel TFT and the TFT of the driving circuit;

FIG. 9 is a sectional view showing a fabrication step of the pixel TFT and the TFT of the driving circuit;

FIGS. 10(A) to 10(B) are sectional views showing a fabrication step of the pixel TFT and the TFT of the driving circuit;

FIGS. 11(A) to 11(B) are sectional views showing a fabrication step of an active matrix type liquid crystal display device;

DESCRIPTION OF THE PREFERRED EMBODIMENTS

Figures 5A, 5B, 5C:
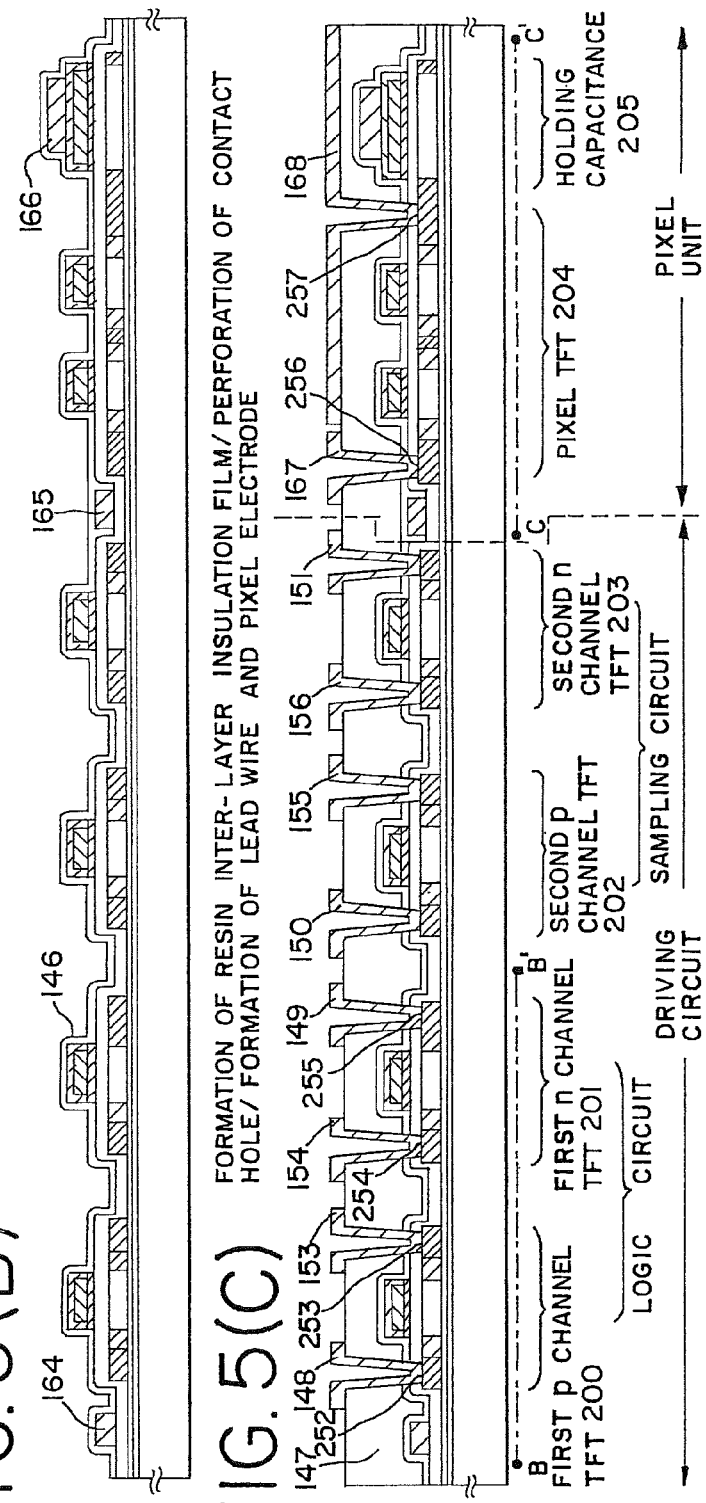
FIGS. 5(A) to 5(C) are sectional views showing a fabrication step of the pixel TFT and the TFT of the driving circuit.

Hereinafter, preferred embodiments of the present invention will be explained in detail.

Embodiment 1

The first embodiment of the present invention will be explained with reference to FIGS. 1 to 3. In this embodiment, a method of forming simultaneously pixel TFTs and holding capacitances of a pixel unit and TFTs of a driving circuit disposed round the display region will be explained step-wise in detail.

In FIG. 1(A), barium borosilicate glass or aluminoborosilicate glass as typified by Corning #7059 glass and #1737 glass can be used for a substrate 101. Besides these glass substrates, plastic substrates not having optical anisotropy such as polyethylene terephthalate (PET), polyethylene naphthalate (PEN), polyethersulfone (PES), etc, can be used, too. When the glass substrate is used, the substrate may be heat-treated in advance at a temperature lower by about 10 to 20° C. than a glass strain point. An underlying film 102 such as a silicon oxide film, a silicon nitride film or a silicon oxide nitride film is formed on the surface of the substrate 101, on which TFT is to be formed, in order to prevent the diffusion of impurities from the substrate 101. For example, the silicon oxide nitride film 102a prepared from $SiH_4$, $NH_3$ and $N_2O$ is formed to a thickness of 10 to 200 nm (preferably, 50 to 100 nm) by a plasma CVD process. Similarly, a hydrogenated silicon oxide nitride film 102b prepared from $SiH_4$ and $N_2O$ is formed to a thickness of 50 to 200 nm (preferably, 100 to 150 nm) in lamination.

The silicon oxide nitride film is formed by using the conventional parallel flat sheet type plasma CVD process. The silicon oxide nitride film 102a is formed by introducing $SiH_4$ at 10 sccm, $NH_3$ at 100 sccm and $N_2O$ at 20 sccm into a reaction chamber under the condition of a substrate temperature of 325° C., a reaction pressure of 40 Pa, a discharge power density of 0.41 $W/cm^2$ and a discharge frequency of 60 MHz. These films can be formed by only changing the substrate temperature and by switching the reactive gases.

The silicon oxide nitride film 102a thus formed has a density of $9.28 \times 10^{22}/cm^3$, has an etching rate of about 63 nm/min in a mixed solution ("LAL500", a product of Stella Chemif a Co.) containing 7.13% of ammonium hydrogenfluoride ($NH_4HF_2$) and 15.4% of ammonium fluoride at 20° C., and is a compact and hard film. When such a film is used for the underlying film, the diffusion of alkali metal elements from the glass substrate into the semiconductor layers formed thereon can be effectively prevented.

Next, a semiconductor layer 103a having a thickness of 25 to 80 nm (preferably, 30 to 60 nm) and an amorphous structure is formed by a known method such as a plasma CVD process or a sputtering process. For example, the amorphous silicon film is formed to a thickness of 55 nm by the plasma CVD process. Semiconductor films having such an amorphous structure include an amorphous semiconductor film and a microcrystalline semiconductor film, and a compound semiconductor film having an amorphous structure such as an amorphous silicon-germanium film may be used. Both underlying film 102 and amorphous semiconductor layer 103a can be formed continuously. For example, after the silicon oxide nitride film 102a and the hydrogenated silicon oxide nitride film 102b are formed continuously by the plasma CVD process as described above, the film formation can be carried out continuously by switching the reactive gases from $SiH_4$, $N_2O$ and $H_2$ to $SiH_4$ and $H_2$ or $SiH_4$ alone, without exposing them once to the atmosphere of the open air. As a result, the contamination of the surface of the hydrogenated silicon oxide nitride film 102b can be prevented, and variance of the characteristics of the TFT to be fabricated and fluctuation of the threshold voltage can be reduced.

The crystallization step is then carried out to form a crystalline semiconductor layer 103b from the amorphous semiconductor layer 103a. A laser annealing method, a thermal annealing method (solid phase growing method) or a rapid thermal annealing method (RTA method) can be used for this method. When the glass substrate or the plastic substrate having a low heat resistance is used, the laser annealing method is employed preferably. The RTA method uses an IR lamp, a halogen lamp, a metal halide lamp or a xenon lamp as the light source. Alternatively, the crystalline semiconductor layer 103b can be formed by the crystallization method using a catalytic element in accordance with the technology disclosed in Japanese Patent Laid-Open No. 7-130652. In the crystallization step, hydrogen contained in the amorphous semiconductor layer is first discharged preferably. After heat-treatment is conducted at 400 to 500° C. for about 1 hour to lower the hydrogen content to 5 atom % or below, the crystallization step is then conducted. In this way, coarsening of the film surface can be prevented advantageously.

When the crystallization step is conducted by the laser annealing method, a pulse oscillation type or continuous light emission type excimer laser, or an argon laser is used as the light source. When the pulse oscillation type excimer laser is used, the laser beam is processed to a linear shape and laser annealing is then conducted. The laser annealing condition can be selected appropriately. For example, the laser pulse oscillation is 30 Hz and the laser energy density is 100 to 500 mJ/cm$^2$ (typically, 300 to 400 mJ/cm$^2$). The linear beams are irradiated to the entire surface of the substrate, and the overlap ratio of the linear beams at this time is 80 to 98%. In this way, the crystalline semiconductor layer 103b can be obtained as shown in FIG. 1(B).

A resist pattern is formed by photolithography that uses a photo-mask 1 (PM1) on the crystalline semiconductor layer 103b. The crystalline semiconductor layer is divided into an island shape by dry etching, forming thereby island-like semiconductor layers 104 to 108. A mixed gas of $CF_4$ and $O_2$ is used for dry etching. To control the threshold voltage (Vth) of the TFT, an impurity for imparting the P type may be applied in a concentration of about $1\times10^{16}$ to $5\times10^{17}$ atoms/cm$^3$ to the entire surface of the island-like semiconductor layers. The elements of the Group XIII of the Periodic Table such as boron (B), aluminum (Al) or gallium (Ga) are known as the impurity elements for imparting the p type to the semiconductor. Ion implantation or ion doping is known as the method of doping these elements, but ion doping is suitable for processing a substrate having a large area. This ion doping method uses diborane ($B_2H_6$) as a source gas and adds boron (B). Injection of such an impurity element is not always necessary and may be omitted. However, this is the method that can be used appropriately for keeping the threshold voltage of the n channel TFT, in particular, within a predetermined range.

A gate insulation film 109 is formed of a silicon-containing insulation film having a thickness of 40 to 150 nm by the plasma CVD method or the sputtering method. For example, it is advisable to form a silicon oxide nitride film having a thickness of 120 nm. The silicon oxide nitride film that is formed by adding $O_2$ to $SiH_4$ and $N_2O$ has a reduced fixed charge density in the film. Therefore, this film is a preferable material for this application. Needless to say, the gate insulation film is not particularly limited to such a silicon oxide nitride film but may be a single layered film of other silicon-containing insulation film or their laminate structure (FIG. 1(C)).

A heat-resistant conductor layer is formed as shown in FIG. 1(D) to form a gate electrode on the gate insulation film 109. The heat-resistant conductor layer may comprise a single layer, but may be a laminate structure of two or more layers, whenever necessary. For example, a laminate structure of the conductor layer (A) 110 made of the conductive metal nitride film and the conductor layer (B) 111 made of the metal film may be preferably used by using such a heat-resistant conductor material. The conductor layer (B) 111 may be made of an element selected from tantalum (Ta), titanium (Ti), molybdenum (Mo) and tungsten (W), or alloys consisting of these elements as the principal component or alloy films comprising the combination of these elements (typically, an Mo—W alloy film, an Mo—Ta alloy film). The conductor layer (A) 110 is formed of tantalum nitride (TaN), tungsten nitride (WN), titanium nitride (TiN) or molybdenum nitride (MoN). Alternatively, tungsten silicide, titanium silicide or molybdenum silicide may be used for the conductor layer (A) 110. The impurity concentration of the conductor layer (B) 111 is preferably lowered so as to achieve a low resistance. As to the oxygen concentration, in particular, the concentration is preferably 30 ppm or below. When the oxygen concentration is 30 ppm or below, a specific resistance value of not higher than 20 μΩcm can be accomplished for tungsten (W), for example.

The thickness of the conductor layer (A) 110 is from 10 to 50 nm (preferably, 20 to 30 nm) and the thickness of the conductor layer (B) 111 is 200 to 400 nm (preferably, 250 to 350 nm). When W is used for the gate electrode, tungsten nitride (WN) is formed to a thickness of 50 nm for the conductor layer (A) 111 and W is formed to a thickness of 250 nm for the conductor layer (B) 110 by the sputtering method using W as a target and by introducing an argon (Ar) gas and a nitrogen ($N_2$) gas. As another method, a thermal CVD method may be used for forming the W film by using tungsten hexafluoride ($WF_6$). In any case, the resistance of the gate electrode must be lowered, and the resistivity of the W film is preferably not higher than 20 μΩcm. The low resistivity of the W film can be accomplished by increasing the crystal grain size, but the resistance becomes high when the contents of the impurity elements such as O in W are great because crystallization is impeded. Therefore, when the sputtering method is employed, the W target used has a purity of 99.9999%, and sufficient attention should be paid lest impurities mix from the gaseous phase during the formation of the film. In this way, the resistivity of 9 to 20 μΩcm can be achieved.

On the other hand, when the conductor layer (A) 110 uses a TaN film and the conductor layer (B) 111 uses a Ta film, these films can be formed simultaneously by sputtering. To form the TaN film, Ta is used as the target and a mixed gas of Ar and nitrogen, as the sputtering gas. Argon (Ar) is used as the sputtering gas to form the Ta film. When a suitable amount of Xe or Kr is added to the sputtering gas, the internal stress of the resulting films can be mitigated and peel of the films can be prevented. The resistivity of the α phase Ta film is about 20 μΩcm, and this film can be used for the gate electrode. However, the resistivity of the β phase Ta film is about 180 μΩcm and this film is not suitable for the gate electrode. The TaN film has a crystal structure approximate to that of the α phase. Therefore, when the Ta film is formed on the TaN film, the α phase Ta film can be obtained easily. Incidentally, it is effective to form a P-doped silicon film to a thickness of about 2 to about 20 mm below the conductor layer (A) 110, though this film is not shown in the drawing. This film improves adhesion of the conductor film to be formed thereon, prevents oxidation and can prevent the diffusion of the alkali metal element, that is contained in a trace amount in the conductor layer (A) 110 or in the conductor layer (B) 111, into the gate insulation film 109. In any case, the resistivity of the conductor layer (B) 111 is preferably within the range of 10 to 50 μΩcm.

Next, resist masks 112 to 117 are formed by photolithography with a photo-mask 2 (PM2). The conductor layer (A) 110 and the conductor layer (B) 111 are collectively etched to form gate electrodes 118 to 122 and a capacitance lead wire 123. These gate electrodes 118 to 122 and capacitance lead wires 123 comprise a unitary structure of 118a to 123a formed of the conductor layer (A) and 118b to 123b formed of the conductor layer (B) (FIG. 2(A)).

The method for etching the conductor layer (A) and the conductor layer (B) may be selected suitably. When the material consisting principally of W is used as described above, however, dry etching using a high density plasma is preferably employed in order to conduct etching at a high speed and with high accuracy. One of the means for obtaining the high density plasma is the one that uses an inductively coupled plasma (ICP) etching apparatus. The etching method of W using the ICP etching apparatus introduces two kinds of gases, that is, $CF_4$ and $Cl_2$, as the etching gas into a reaction chamber, sets the pressure to 0.5 to 1.5 Pa (preferably, 1 Pa) and applies high frequency (13.56 MHz) power of 200 to 1,000 W to the inductively coupled portion. At this time, 20 W high frequency power is applied to the stage on which the substrate is placed. As the substrate is charged to the negative potential by self-bias, the positive ions are accelerated and anisotropic etching can be conducted. When the ICP etching apparatus is used, an etching rate of 2 to 5 nm/sec can be obtained for a hard metal film such as W. To conduct etching without leaving the residue, over-etching is preferably conducted while the etching time is increased at a ratio of about 10 to 20%. However, caution must be paid to the selection ratio of etching with respect to the underlying layer. For example, the selection ratio of the silicon oxide nitride film (gate insulation film 109) to the W film is 2.5 to 3. Therefore, when the over-etching treatment is conducted, the surface on which the silicon oxide nitride film is exposed is etched by about 20 to 50 nm and becomes substantially thin.

To form an LDD region in the n channel TFT, a doping step of an impurity element for imparting the n type ($n^-$ doping step) is conducted. Here, the n-imparting impurity element is doped by ion-doping in self-alignment with the gate electrodes 118 to 122 and the capacitance lead wire 123 as the mask. The concentration of phosphorus (P) doped as the n-imparting impurity element is within the range of $1 \times 10^{16}$ to $5 \times 10^{19}$ atoms/cm$^3$. In this way, the n impurity regions 124 to 129 having the first concentration is formed in the island-like semiconductor layer as shown in FIG. 2(B).

Next, an n type impurity region having a second concentration, that functions as a source or drain region in the n channel TFT, is formed ($n^+$ doping step). First, resist masks 130 to 134 are formed using a photo-mask 3 (PM3), and the n-imparting impurity element is doped to form n impurity regions 135 to 140 having the second concentration. Phosphorus (P) is used as the n-imparting impurity element. Ion doping using phosphine (PH$_3$) is employed so that the concentration falls within the range of $1 \times 10^{20}$ to $1 \times 10^{21}$ atoms/cm$^3$ (FIG. 2(C)).

P impurity regions 144 and 145 having a third concentration are formed as the source and drain regions in the island-like semiconductor layers 104 and 106 forming the p channel TFT. Here, a p-imparting impurity element is doped with the gate electrodes 118 and 120 as the mask, and the p impurity regions having the third concentration are formed in self-alignment. At this time, resist masks 141 to 143 are formed on the island-like semiconductor films 105, 107 and 108 forming the n channel TFT using a photo-mask 4 (PM4) in such a manner as to cover the entire surface. P impurity regions 144 and 145 having the third concentration are formed by ion doping that uses diborane (B$_2$H$_6$). The boron (B) concentration in the regions is $3 \times 10^{20}$ to $3 \times 10^{21}$ atoms/cm$^3$ (FIG. 2(D)).

Phosphorus (P) is added in a pre-step to the p impurity regions 144 and 145 having the third concentration. The p impurity regions 144a and 145a having the third concentration have a concentration of $1 \times 10^{20}$ to $1 \times 10^{21}$ atoms/cm$^3$, and the p impurity regions 144b and 145b having the third concentration have a concentration of $1 \times 10^{16}$ to $5 \times 10^{19}$ atoms/cm$^3$. The concentration of boron (B) added in this step is set to become 1.5 to 3 times. In consequence, no trouble occurs in the function as the source and drain regions of the p channel TFT.

Thereafter, as shown in FIG. 3(A), a protective insulation film 146 is formed from above the gate electrode and the gate insulation film. The protective insulation film may comprise a silicon oxide film, a silicon oxide nitride film, a silicon nitride film or a laminate film comprising the combination of these films. In any case, the protective insulation film 146 is formed of an inorganic insulating material. The protective insulation film 146 has a film thickness of 100 to 200 nm. When the silicon oxide film is used, tetraethyl orthosilicate (TEOS) and O$_2$ are mixed, and plasma CVD process is conducted to generate discharge at a reaction pressure of 40 Pa, a substrate temperature of 300 to 400° C. and a high frequency (13.56 MHz) power density of 0.5 to 0.8 W/cm$^2$. When the silicon oxide nitride film is used, the plasma CVD method is employed to form the silicon oxide nitride film from SiH$_4$ and N$_2$O. The film formation condition in this case is the reaction pressure of 20 to 200 Pa, the substrate temperature of 300 to 400° C., and the high frequency (60 MHz) power density of 0.1 to 1.0 W/cm$^2$. The hydrogenated silicon oxide nitride film formed from SiH$_4$, N$_2$O and H$_2$ may be used, as well. The silicon nitride film can be formed similarly from SiH$_4$ and NH$_3$ by the plasma CVD method.

Thereafter, the activation step of activating the n- or p-imparting impurity elements added in the respective concentrations is conducted. This step is conducted by a thermal annealing method using a furnace annealing oven. Besides the thermal annealing method, it is possible to employ a laser annealing method and a rapid thermal annealing method (RTA method). The thermal annealing method is conducted in a nitrogen atmosphere containing oxygen in a concentration of 1 ppm or below, preferably 0.1 ppm or below, at 400 to 700° C., typically 500 to 600° C. In this embodiment, the heat-treatment is conducted at 550° C. for 4 hours. When a plastic substrate having a low heat-resistant temperature is used for the substrate 101, the laser annealing method is preferably employed (FIG. 3(B)).

After the activation step, heat-treatment is further conducted in an atmosphere containing 3 to 100% hydrogen at 300 to 450° C. for 1 to 12 hours to hydrogenate the island-like semiconductor film. This is the process step that terminates the dangling bonds of $10^{16}$ to $10^{18}$/cm$^3$ in the island-like semiconductor film by hydrogen that is thermally excited. Plasma hydrogenation (using hydrogen that is excited by plasma) may be used as another means for hydrogenation.

After the activation and hydrogenation steps are completed, an inter-layer insulation film 147 made of an organic insulation material is formed to a mean thickness of 1.0 to 2.0 μm. Examples of the organic resinmaterials are polyimide, acryl, polyamide, polyimidamide, BCB (benzocyclobutene), and so forth. When polyimide of the type, that is thermally polymerized after being applied to the substrate, is used, the material is baked at 300° C. in a clean oven. When acryl is used, a two-component type is used. After the main agent and the curing agent are mixed, the mixture is applied to the entire surface of the substrate by using a spinner. Preparatory heating is then conducted by using a hot plate at 80° C. for 60 seconds, and baking is then made in the clean oven at 250° C. for 60 minutes.

When the inter-layer insulation film is formed of the organic insulating material, its surface can be planarized satisfactorily. The organic resin materials have generally a low dielectric constant, and the parasitic capacitance can be reduced. However, since they are hygroscopic, they are not suitable for the protective film. Therefore, the organic insulation material must be used in combination with the silicon oxide film, the silicon oxide nitride film or the silicon nitride film formed as the protective insulation film 146 as, in this embodiment.

Thereafter, a resist mask having a predetermined pattern is formed by using a photo-mask 5 (PM5). Contact holes reaching the source or drain regions of the respective island-like semiconductor films are formed. The contact holes are formed by dry etching. In this case, a mixed gas of CF$_4$, O$_2$ and He is used as the etching gas. The inter-layer insulation film formed of the organic resin material is first etched. Then, the etching gas is switched to CF$_4$ and O$_2$, and the protective insulation film 146 is etched. To improve the selection ratio with the island-like semiconductor layers, the etching gas is switched further to $CHF_3$ and the gate insulation film is etched. In this way, the contact holes can be formed satisfactorily.

A conductive metal film is formed by sputtering or vacuum deposition. A resist mask pattern is then formed by using a photo-mask (PM6). Source lead wires 148 to 152 and drain lead wires 153 to 158 are formed by etching. Here, the drain lead wire 157 functions as the pixel electrode. Though not shown in the drawing, this embodiment uses a 50 to 150 nm-thick Ti film for this electrode. A contact with the semiconductor film of the island-like semiconductor layer for forming the source or drain region is formed, and aluminum (Al) is formed to a thickness of 300 to 400 nm in superposition with the Ti film to give the lead wire.

When the hydrogenation treatment is conducted under this state, favorable results can be obtained for the improvement of TFT performance. For example, the heat-treatment is conducted preferably at 300 to 450° C. for 1 to 12 hours in an atmosphere containing 3 to 100% of hydrogen. A similar effect can be obtained by using the plasma hydrogenation method. Such a heat-treatment can diffuse hydrogen existing in the protective insulation film 146 and the underlying film 102 into the island-like semiconductor films 104 to 108 and can hydrogenate these films. In any case, the defect density in the island-like semiconductor films 104 to 108 is lowered preferably to $10^{16}/cm^3$ or below, and for this purpose, hydrogen may be added in an amount of about 0.01 to about 0.1 atomic % (FIG. 3(C)).

When the six photo-masks are used as described above, a substrate having the TFTs of the driving circuit and the pixel TFTs of the pixel unit on the same substrate can be completed. The first p channel TFT 200, the first n channel TFT 201, the second p channel TFT 202 and the second n channel TFT 203 are formed in the driving circuit. The pixel TFT 204 and the holding capacitance 205 are formed in the pixel unit. In this specification, such a substrate will be referred to as an "active matrix substrate" for convenience sake.

The first p channel TFT 200 in the driving circuit has a single drain structure that includes the channel formation region 206, the source regions 107a and 107b and the drain regions 208a and 208b each comprising the p impurity region having the third concentration in the island-like semiconductor film 104. The first n channel TFT 201 includes the channel formation region 209 in the island-like semiconductor film 105, the LDD region 210 that does not overlap with the gate electrode 119 and comprises the n type impurity region having the first concentration, and the source region 212 and the drain region 211 comprising the n impurity region of the second concentration. The length of this LDD region in the direction of the channel length is 1.0 to 4.0 μm, preferably 2.0 to 3.0 μm. As the length of the LDD region in the n channel TFT is determined in this way, a high electric field occurring in the proximity of the drain region can be mitigated, and the occurrence of hot carriers and degradation of the TFT can be prevented. The second p channel TFT 202 in the driving circuit has similarly the single drain structure including the channel formation region 213, the source regions 214a and 214b and the drain regions 215a and 215b comprising the p impurity region having the third concentration in the island-like semiconductor film 106. A channel formation region 216, LDD regions 217 and 218 comprising the n impurity region of the first concentration, and a source region 220 and a drain region 219 comprising the n impurity region of the second concentration are formed in the second n channel TFT 203. The length of the LDD of this TFT, too, is also set to 1.0 to 4.0 μm. The pixel TFT 204 includes channel formation regions 221 to 222 and LDD regions 226 to 228 comprising an n impurity region of the first concentration in the island-like semiconductor film 108. The length of the LDD region in the direction of the channel length is 0.5 to 4.0 μm, preferably 1.5 to 2.5 μm. Furthermore, a holding capacitance 205 comprises a capacitance lead wire 123, an insulation film made of the same material as the gate insulation film and a semiconductor layer 229 for connecting the drain region 228 of the pixel TFT 204. In FIG. 3(C), the pixel TFT 204 is shown as having a double gate structure. However, it may have a single gate structure or a multi-gate structure having a plurality of gate electrodes.

Figure 16:
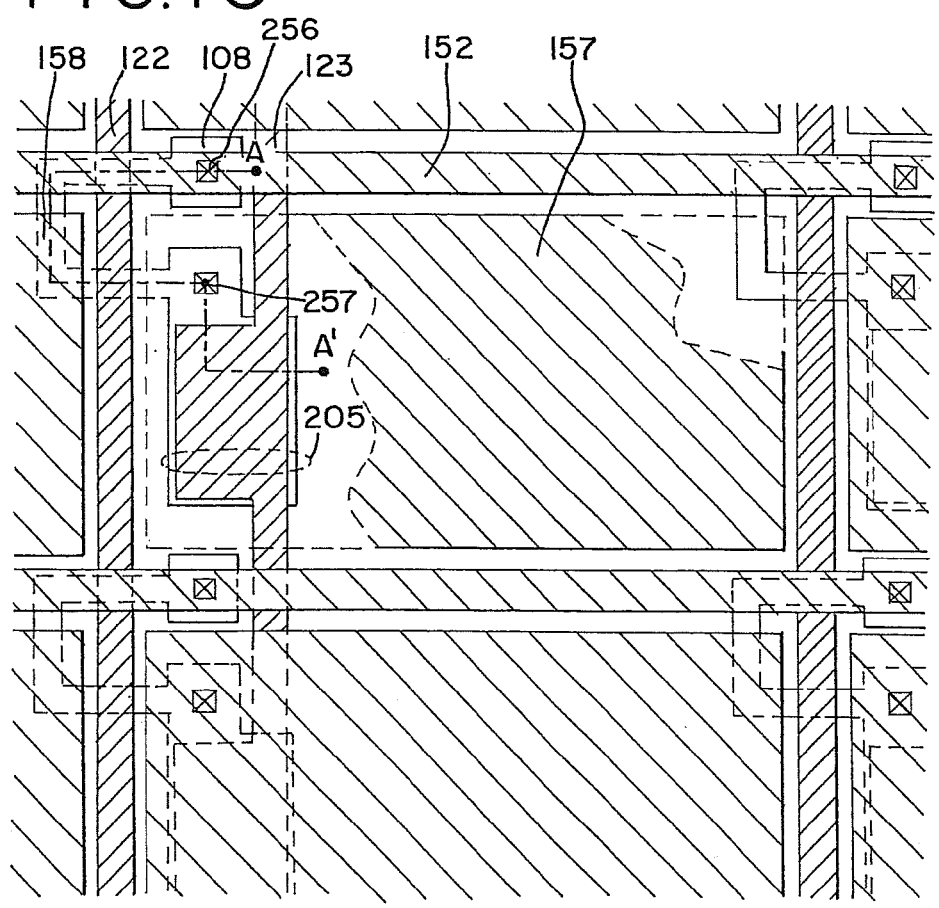
FIG. 16 is a top view showing the pixel of the pixel unit.

FIG. 16 is a top view showing substantially one pixel of the pixel unit. The section A-A' in the drawing corresponds to the sectional view of the pixel unit shown in FIG. 3(C). The gate electrode 122 of the pixel TFT 204, that functions also the gate lead wire, crosses the island-like semiconductor layer 108 below it through a gate insulation film, not shown in the drawing. The source region, the drain region and the LDD region are formed in the island-like semiconductor layer, though they are not shown in the drawing. Reference numeral 256 denotes a contact portion between the source lead wire 152 and the source region 226. Reference numeral 257 denotes a contact portion between the drain lead wire 157 and the drain region 228. A holding capacitance 205 is formed by the overlapping region of the semiconductor layer 229 that extends from the drain region 228 of the pixel TFT 204 and a holding capacitance lead wire 123 through the gate insulation film. In this construction, an impurity element for controlling the valency electron is not added to the semiconductor layer 229.

The construction described above makes it possible to optimize the structure of the TFT constituting each circuit in accordance with the specification required by the pixel TFT and the driving circuit, and to improve operation performance and reliability of the semiconductor device. Furthermore, this construction makes it easy to activate the LDD region, the source region and the drain region by forming the gate electrode by a conductive material having heat resistance.

Embodiment 2

To accomplish a high-precision high-quality liquid crystal display device, the characteristics of the TFT constituting the pixel TFT and the driving circuit must be improved. One of the required TFT characteristics is the decrease of the current flowing under the OFF state (OFF current) besides the threshold voltage, the field effect mobility, the sub-threshold coefficient (S value), and so forth. When the OFF current value is high, power consumption increases and moreover, the operation characteristics of the driving circuit get deteriorated and may invite the drop of image quality. In the n channel TFT fabricated in Embodiment 1, the LDD region is formed, and this LDD region can lower the OFF current value to the extent that renders no problem. On the other hand, since the p channel type TFT has the single drain structure, the increase of the OFF current value becomes often the problem. This embodiment provides a method of fabricating a p channel TFT having an offset region suitable to cope with such a problem.

The process steps shown in FIGS. 1(A) to 2(A) are conducted first in the same way as in Embodiment 1, and the gate electrodes 118 to 122 and the capacitance lead wire 123 are formed. Next, the step of adding the n-imparting impurity element (n⁻ doping step) is conducted to form the LDD region in the n channel TFT. Here, the n-imparting impurity element is added in self-alignment by using a photo-mask 7. In this case, the entire surface of island-like semiconductor layers 104 and 106, on which the p channel TFT is to be formed, is covered with resist masks 159 and 160 using the photo-mask 7 lest the impurity element is added to these layers. In this way, the n impurity regions 125 to 129 having the first concentration are formed in the island-like semiconductor layer as shown in FIG. 4(A).

Next, in the n channel TFT, an n impurity region having the second concentration that functions as the source or drain region is formed. Resist masks 130 to 134 are formed by using a photo-mask, and an n-imparting impurity element is added to form n impurity regions 135 to 140 having the second concentration (FIG. 4(B)).

Thereafter, a protective insulation layer 146 is formed in the same way as in Embodiment 1. P impurity regions 144 and 145 having the third concentration to serve as the source and drain regions are formed in the island-like semiconductor layers 104 and 106 that constitute the p channel TFT. Resist masks 161 to 163 are formed by using the photo-mask 4 to cover the entire surface of the island-like semiconductor films 105, 107 and 108 that constitute the n channel TFT. This step is conducted by ion doping. The impurity element doped has slight fluctuation but is incident substantially vertically to the surface of the island-like semiconductor layers. The protective insulation layer formed at the end portion functions as the mask. Therefore, p type impurity regions 144 and 145 having the third concentration are formed in the spaced-apart relation from the gate electrode by the distance corresponding to the film thickness. In other words, offset regions 230 and 231 are formed to a length Lo between the channel formation region and the p impurity region having the third concentration. More concretely, since the length Lo corresponds to the thickness of the protective insulation layer 46, it is formed to a length of 100 to 200 nm.

Such an offset region contributes as a series resistance component to the electric characteristics of the TFT, and can reduce the OFF current value by about 1/10 to 1/100. Subsequently, the process steps from FIG. 3(A) are carried out in the same way as in Embodiment 1. An active matrix substrate can be completed by using seven photo-masks.

Embodiment 3

Embodiment 1 represents the example that uses the heat-resistant conductive material such as W and Ta for the gate electrode. The reason why such materials are used is mainly because the impurity elements are activated by thermal annealing at 400 to 700° C. to control the valency electrons after the gate electrode is formed. However, such heat-resistant conductive material has the area resistance of about 10Ω and are not suitable for a liquid crystal display device having a screen size of 4 inches or more. When the gate lead wire connected to the gate electrode is made of the same material, the extension length of the lead wire becomes essentially great, and the wiring delay resulting from the influence of the wiring resistance cannot be neglected.

When the pixel density is VGA, for example, 480 gate lead wires and 640 source lead wires are formed. When the pixel density is XGA, 768 gate lead wires and 1,024 source lead wires are formed. As for the screen size of the display region, the length of the diagonal is 340 mm in the case of the 13-inch class and 460 mm in the case of the 18-inch class. This embodiment explains the method of accomplishing such a liquid crystal display device by using low resistance conductive materials such as Al or Cu (copper) for the gate lead wires with reference to FIG. 5.

First, the process steps shown in FIGS. 1(A) to 2(D) are conducted in the same way as in Embodiment 1. Next, the activation step for activating the impurity elements added to the respective island-like semiconductor layer is conducted to control the valency electron. This step is carried out by the thermal annealing method using the furnace annealing oven. The laser annealing method or the rapid thermal annealing method (RTA method) can be employed besides the thermal annealing method. This thermal annealing method is conducted in a nitrogen atmosphere having an oxygen concentration of 1 ppm or below, preferably 0.1 ppm or below, at 400 to 700° C., typically at 500 to 600° C. In this embodiment, the heat-treatment is conducted at 525° C. for 4 hours.

In this heat-treatment, conductor layers (C) 118c to 123c are formed to a thickness of 5 to 80 nm from the surface on the conductor layers (B) 118b to 123b forming the gate electrodes 118 to 122 and the capacitance lead wire 123. When the conductor layers (B) 118b to 123b are made of tungsten (W), for example, tungsten nitride (WN) is formed and when they are made of tantalum (Ta), tantalum nitride (TaN) is formed. The conductor layers (C) 118c to 123c can be formed similarly by exposing the gate electrodes 118 to 123 to a plasma atmosphere containing nitrogen or ammonia. The heat-treatment is carried out further in an atmosphere containing 3 to 100% hydrogen at 300 to 450° C. for 1 to 12 hours to hydrogenate the island-like semiconductor layers. This process step is the one that terminates the dangling bonds of the semiconductor layers by thermally excited hydrogen. Plasma hydrogenation (using hydrogen excited by plasma) may be used as another hydrogenation means (FIG. 5(A)).

After the activation and hydrogenation steps are completed, the gate lead wires are made of the low resistance conductive material. The low resistance conductor layer is formed of a conductor layer (D) containing Al or Cu as the principal component. For example, an Al film (not shown) containing 0.1 to 2 wt % of Ti is formed as the conductor layer (D) on the entire surface. The thickness of the conductor layer (D) is 200 to 400 nm (preferably, 250 to 350 nm). Predetermined resist patterns are formed using a photo-mask and etching is conducted to form the gate lead wires 164 and 165 and the capacitance lead wire 166. This etching is made by wet etching using a phosphoric acid type etching solution and removes the conductor layer (D). In this way, the gate lead wires can be formed while keeping selective processability with the underlying layers. A protective insulation film 146 is then formed (FIG. 5(B)).

Figure 6A:
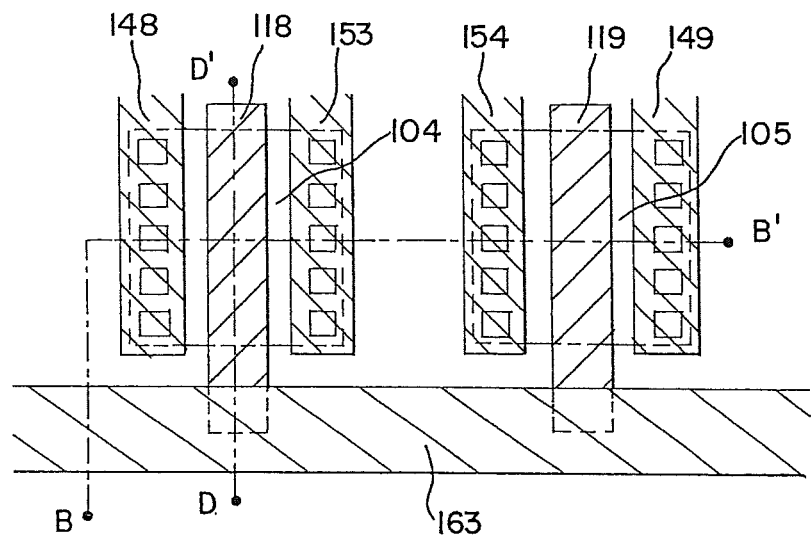
FIGS. 6(A) and 6(B) are top views showing the construction of the TFT of the driving circuit and the pixel TFT.
Figure 6B:
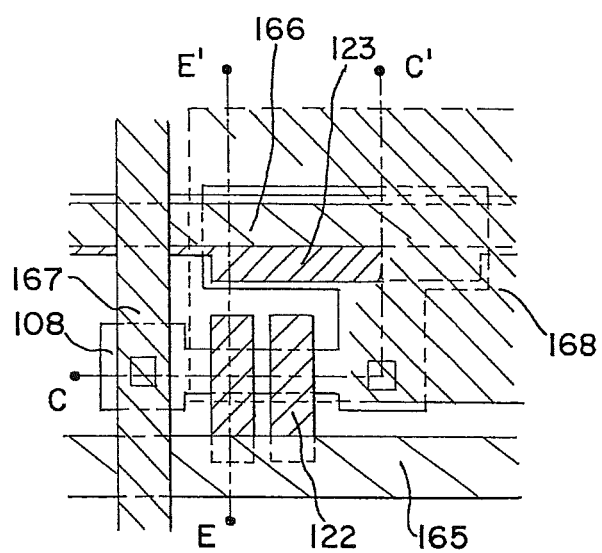
Figure 7A:
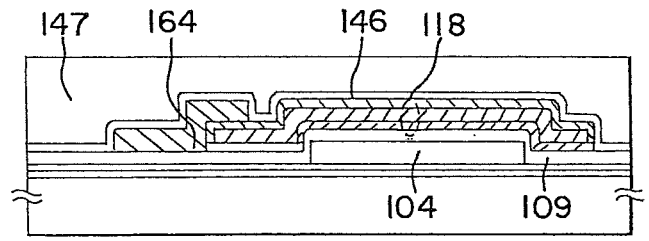
FIGS. 7(A) and 7(B) are sectional views showing a fabrication step of the TFT of the driving circuit.
Figure 7B:
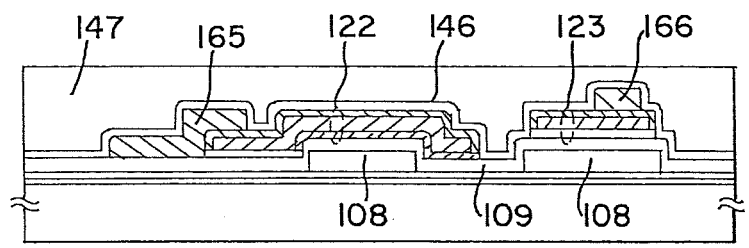

An inter-layer insulation film 147 made of an organic insulating material, source lead wires 148 to 151 and drain lead wires 153 to 156 and 168 are formed in the same way as in Embodiment 1. An active matrix substrate can be thus completed. FIGS. 6(A) and 6(B) are top views of this state. The B-B' section of FIG. 6(A) and the C-C' section of FIG. 6(B) correspond to A-A' and C-C' of FIG. 5(C), respectively. The gate insulation film, the protective insulation film and the inter-layer insulation film are shown omitted in FIGS. 6(A) and 6(B). However, the source lead wires 148, 149 and 167 and the drain lead wires 153, 154 and 168 are connected to the source and drain regions, not shown, of the island-like semiconductor layers 104, 105 and 108 through contact holes. The D-D" section of FIG. 6(A) and the E-E' section of FIG. 6(B) are shown in FIGS. 7(A) and 7(B), respectively. The gate lead wires 164 and 165 are formed in such a fashion that the former 164 overlaps with the gate electrodes 118 and 119 and the latter 165 overlaps with the gate electrode 122, outside the island-like semiconductor layers 104, 105 and 108, respectively. The conductor layer (C) and the conductor layer (D) that come into mutual contact are mutually connected electrically. As the gate lead wires are formed of the low resistance conductive material in this way, the wiring resistance can be lowered sufficiently. Therefore, this embodiment can be applied to the display device having the pixel unit (screen size) of the 4-inch class.

Embodiment 4

The active matrix substrate fabricated in Embodiment 1 can be as such applied to a reflection type liquid crystal display device. When it is applied to a transmission type liquid crystal display device, the pixel electrode provided to each pixel of the pixel unit needs only be formed of the transparent electrode. In this embodiment, a method of fabricating the active matrix substrate adapted to the transmission type liquid crystal display device will be explained with reference to FIG. 10.

The active matrix substrate is produced in the same way as in Embodiment 1. In FIG. 10(A), the source lead wire and the drain lead wire are formed by sputtering or a vacuum depositing a conductive metal film. A Ti film is formed to a thickness of 50 to 150 nm and a contact is formed with the semiconductor film for forming the source or drain region of the island-like semiconductor layer. Aluminum (Al) is formed to a thickness of 300 to 400 nm in superposition with the Ti film. Furthermore, a Ti film or a titanium nitride (TiN) film is formed to a thickness of 100 to 200 nm. In this way, a three-layered structure is completed. Thereafter, a transparent conductive film is formed on the entire surface, and pixel electrodes 171 are formed by patterning treatment and etching treatment with a photo-mask. The pixel electrodes 171 are formed on the inter-layer insulating film 147, and a portion overlapping with the drain lead wire 169 of each pixel TFT 204 is disposed to form a connection structure.

In FIG. 10(B), a transparent conductor film is first formed on the inter-layer insulation film 147, and pixel electrodes 171 are formed through patterning treatment and etching treatment. Drain lead wires 169 are then formed at portions overlapping with the pixel electrodes 171. A Ti film is formed to a thickness of 50 to 150 nm as the drain lead wire 169 and is brought into contact with a semiconductor film forming the source or drain region on the island-like semiconductor layer. Aluminum (Al) is formed to a thickness of 300 to 400 nm in superposition with the Ti film. According to this construction, the pixel electrode 171 comes into contact with only the Ti film that forms the drain lead wire 169. As a result, the reaction between the transparent conductor film and Al can be prevented.

Indium oxide ($In_2O_3$) or an indium oxide-tin oxide alloy ($In_2O_3$—$SnO_2$; ITO) is sputtered or vacuum deposited as the material of the transparent conductor film. Etching of such a material is made by using a hydrochloric acid type solution. However, because the residue is likely to remain particularly in etching of ITO, indium oxide-zinc oxide alloy ($In_2O_3$—ZnO) may be used to improve the etching factor. The indium oxide-zinc oxide alloy is excellent in surface flatness and heat stability with respect to ITO. Therefore, this material can prevent the corrosive reaction with Al with which it comes into contact on the end face of the drain lead wire 169. Similarly, zinc oxide (ZnO) is a suitable material, and zinc oxide containing gallium (Ga) for improving transmissivity of the visible rays and the electric conductivity (ZnO:Ga) can be used, too.

In this way, an active matrix substrate adaptable to the transmission type liquid crystal display device can be completed. Though this embodiment has been explained by using the same process steps as those of Embodiment 1, this construction can be applied to the active matrix substrate represented in Embodiment 2 and Embodiment 3.

Embodiment 5

This embodiment represents another method of fabricating the crystalline semiconductor layer for forming the active layer of the TFT of the active matrix substrate represented by Embodiments 1 through 4. The crystalline semiconductor layer is formed by crystallizing the amorphous semiconductor layer by thermal annealing, laser annealing or RTA. In addition, the crystallization method using a catalytic element, that is disclosed in Japanese Patent Laid-Open No. 7-130652, can be applied. An example of this case will be explained with reference to FIG. 8.

Figure 8A:
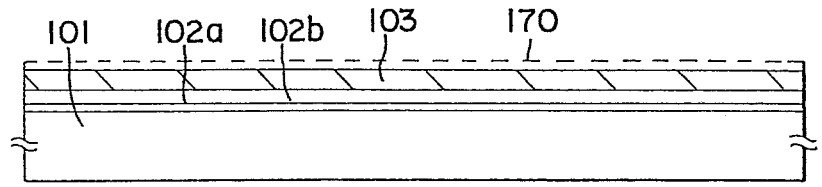
FIGS. 8(A) to 8(C) are sectional views showing a fabrication step of a crystalline semiconductor film.

Undelying films 102a and 102b and an amorphous semiconductor layer 103a are formed to a thickness of 25 to 80 nm on a glass substrate 101 in the same way as in Embodiment 1 as shown in FIG. 8(A). An amorphous silicon film, for example, is formed to a thickness of 55 nm. An aqueous solution containing 10 ppm, calculated by weight, of a catalytic element is applied by a spin coating method to form a layer 170 containing the catalytic element. Examples of the catalytic element include nickel (Ni), germanium (Ge), iron (Fe), palladium (Pd), tin (Sn), lead (Pb), cobalt (Co), platinum (Pt), copper (Cu) and gold (Au). Besides spin coating, the layer 170 containing the catalytic element may be formed by sputtering or vacuum deposition so that the thickness of the layer of the catalytic element is 1 to 5 nm.

Figure 8B:
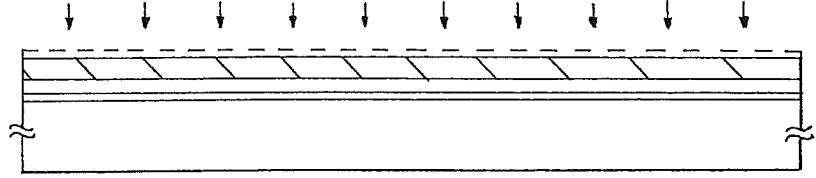
Figure 8C:
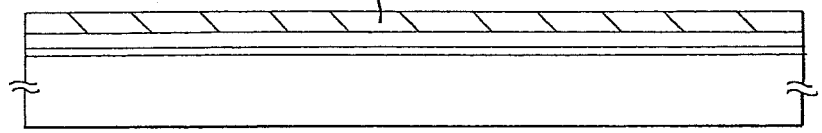

In the crystallization step shown in FIG. 8(B), heat treatment is conducted first at 400 to 500° C. for about 1 hour and the hydrogen content of the amorphous silicon film is lowered to not greater than 5 atom %. Heat annealing is then conducted in a nitrogen atmosphere at 550 to 600° C. for 1 to 8 hours inside a furnace annealing oven. This process step can acquire a crystallin silicon layer 103c comprising the crystalline silicon film (FIG. 8(C)). When the crystalline semiconductor layer 103c formed by heat annealing is observed microscopically through an optical microscope in this case, however, amorphous regions are found sometimes remaining locally in the crystalline semiconductor layer 103c formed by this heat annealing, and amorphous components having a broad peak at 480 $cm^{-1}$ is observed by a Raman spectroscopy. Therefore, it is effective to process the crystalline semiconductor layer 103c by the laser annealing method after heat annealing in the same way as in Embodiment 1 to improve its crystallinity.

A gettering treatment with phosphorus (P) for this purpose can be conducted simultaneously with the activation step explained in FIG. 3(B). This process step is shown in FIG. 9. The concentration of phosphorus (P) necessary for gettering may be approximate to the impurity concentration of the high concentration n impurity region. Thermal annealing of the activation step can allow the catalytic element to segregate from the channel formation region of the n channel TFT and the p channel TFT to the impurity region containing phosphorus (P) in that concentration (in the direction indicated by an arrow in FIG. 9). As a result, the catalytic element segregates in a concentration of $1 \times 10^{17}$ to $1 \times 10^{19}$ atoms/$cm^3$ in the impurity region. The TFT thus fabricated has a lowered OFF current value and has high crystallinity. Therefore, a high field effect mobility can be obtained, and excellent characteristics can be accomplished.

Embodiment 6

Figure 13:
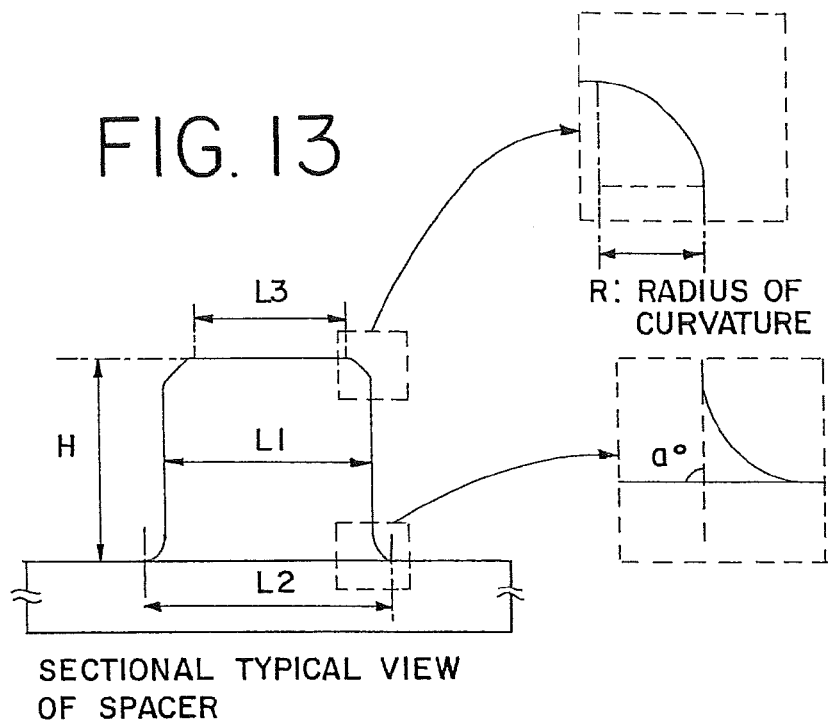
FIG. 13 is an explanatory view useful for explaining the shape of a columnar spacer.

This embodiment explains the fabrication steps of an active matrix liquid crystal display device from the active matrix substrate fabricated in Embodiment 1. First, as shown in FIG. 11(A), a spacer comprising a columnar spacer is formed on the active matrix substrate under the state shown in FIG. 3(C). The spacer may be formed by spraying of particles having a size of several microns. In this embodiment, however, a resin film is formed over the entire surface of the substrate and is then patterned. The material of the spacer is not limited, in particular. This embodiment uses "NN700" of JSR Co. After the resin film is applied by a spinner, a predetermined pattern is formed by exposure and development. The pattern is heated and cured at 150 to 200° C. in a clean oven, or the like. The shape and size of the spacer can be changed depending on the conditions of exposure and development. Preferably, however, the columnar spacer 173 has a columnar shape with a flat top as shown in FIG. 13. When the substrate on the opposite side is put, the mechanical strength as the liquid crystal display panel can be secured. The shape is not particularly limited and may be conical or pyramidal. When it is conical, for example, the height H is 1.2 to 5 μm, the mean radius L1 is 5 to 7 μm and the ratio of the mean radius L1 to the radius L2 of the bottom is 1:1.5. The taper angle of the side surface is not greater than ±15° at this time.

The arrangement of the spacer may be decided arbitrarily. Preferably, however, the columnar spacer 173 is disposed in such a manner as to be superposed with, and cover, the contact portion 251 of the drain lead wire 157 (pixel electrode) in the pixel unit as shown in FIG. 11(A). Since planarity of the contact portion 251 is lost and the liquid crystal is not oriented sufficiently at this portion, the columnar spacer 173 is formed in the form in which the spacer resin is packed to the contact portion 251. In this way, discrimination, or the like, can be prevented.

Thereafter, the orientation film 174 is formed. A polyimide resin is used generally for the orientation film of the liquid crystal display element. After the orientation film is formed, rubbing treatment is conducted so that the liquid crystal molecules are oriented with a certain predetermined pre-tilt angle. The region from the end portion of the columnar spacer 173 disposed in the pixel unit to the region that is not rubbed, in the rubbing direction is not greater than 2 μm. The occurrence of static electricity often becomes the problem during the rubbing treatment. When the spacer 172 is formed on the TFT of the driving circuit, too, both original role as the spacer and the protection effect of the TFT from static electricity can be acquired.

A shading film 176, a transparent conductor film 177 and an orientation film 178 are formed on an opposed substrate 175 on the opposite side. Ti, Cr, Al or the like is formed to a thickness of 150 to 300 nm as the shading film 176. The active matrix substrate on which the pixel unit and the driving circuit are formed and the opposed substrate are bonded to each other through a sealant 179. A filler 180 is mixed in the sealant 179. These two substrates are bonded together while keeping a uniform gap by the filler 180 and the spacers 172 and 173. Thereafter, a liquid crystal material 50 is charged between both substrates, and the substrates are completely sealed by the sealant (not shown). A known liquid crystal material may be used for the liquid crystal material. In this way, the active matrix type liquid crystal display device shown in FIG. 11(B) can be completed.

Figure 19:
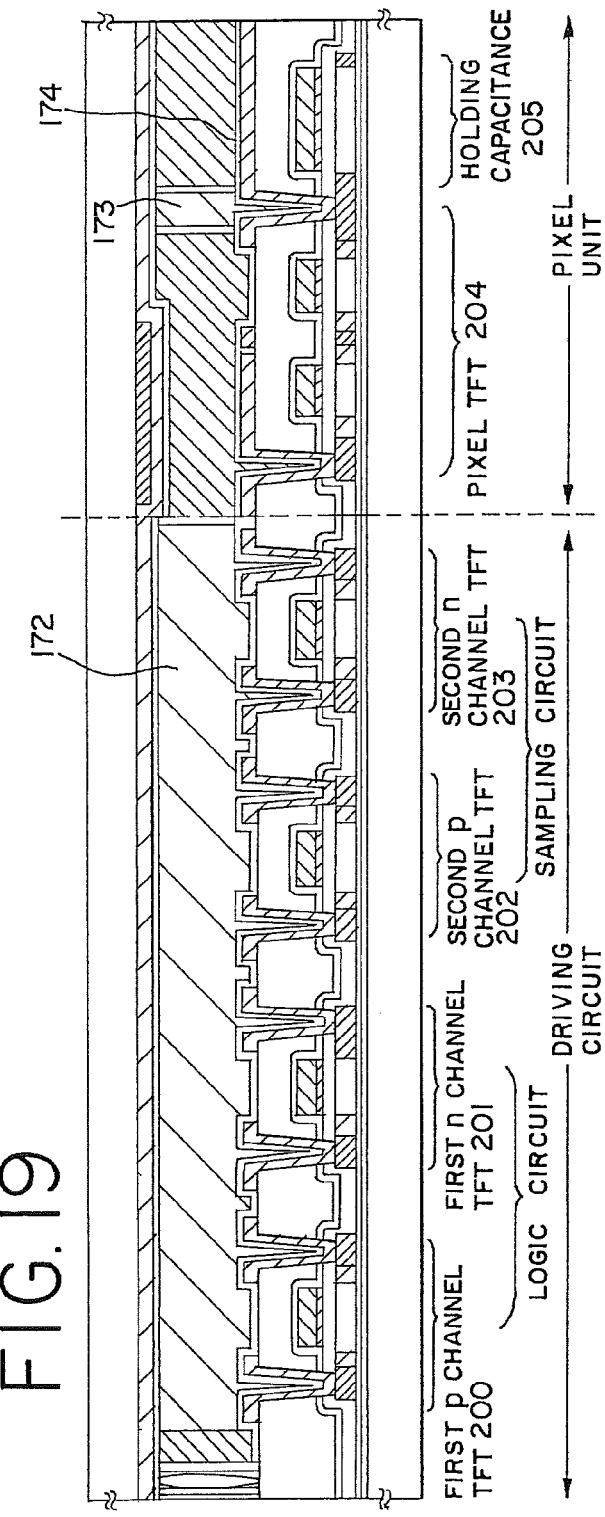
FIG. 19 is a sectional view showing a fabrication step of an active matrix type liquid crystal display device.
Figure 20:
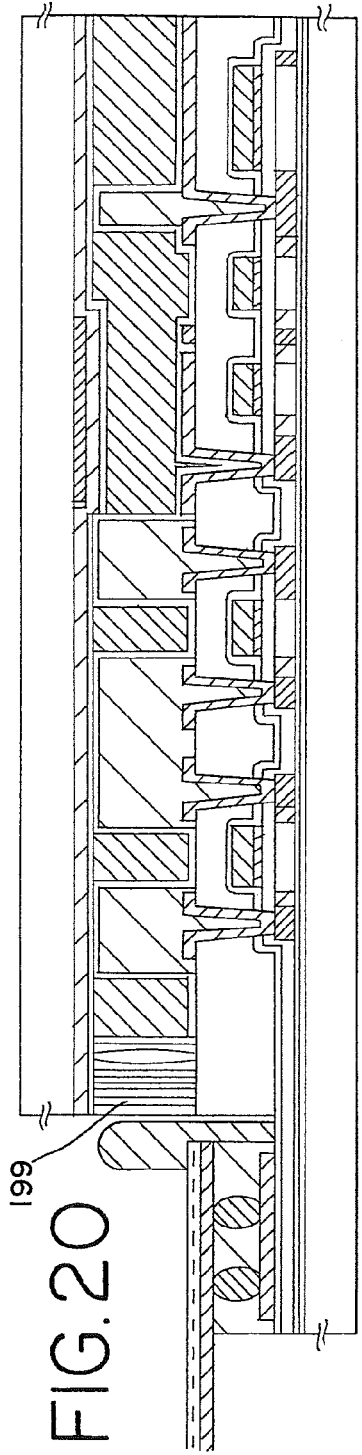
FIG. 20 is an explanatory view useful for explaining the connection structure between the flexible printed board and the external input/output terminals.

It is also possible to first form the orientation film 174 and then to form the spacer comprising the columnar spacer, as shown in FIG. 19.

Figure 12:
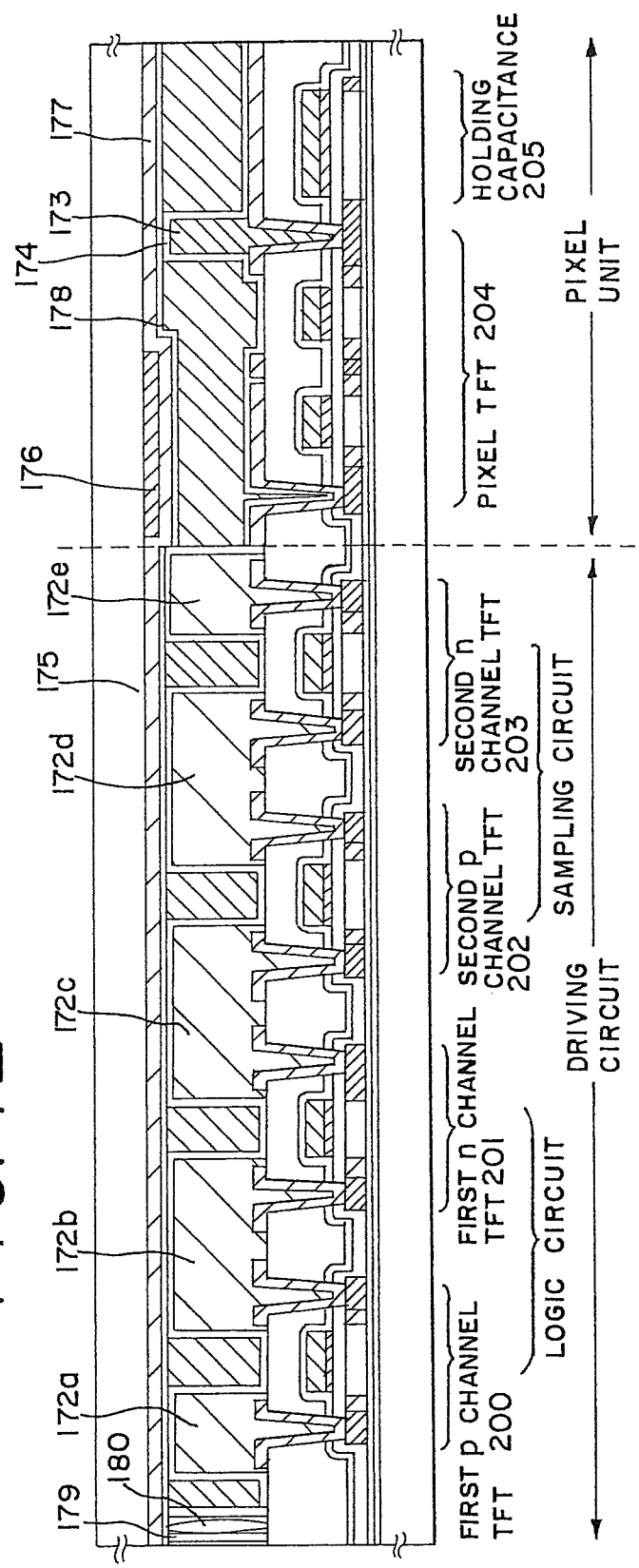
FIG. 12 is a sectional view showing a fabrication step of the active matrix type liquid crystal device.

FIG. 11 shows the example where the spacer 172 is formed on the entire surface of the TFT of the driving circuit. However, the spacer may be divided into a plurality of segment spacers 172*a* to 172*e* as shown in FIG. 12. The spacer that is to be disposed at the formation portion of the driving circuit may be formed in such a manner as to cover at least the source and drain lead wires of the driving circuit. According to this construction, each TFT of the driving circuit is completely covered and protected by the protective insulation film 146, the inter-layer insulation film 147 and the spacer 172 or the spacers 172*a* to 172*e*.

Figure 14:
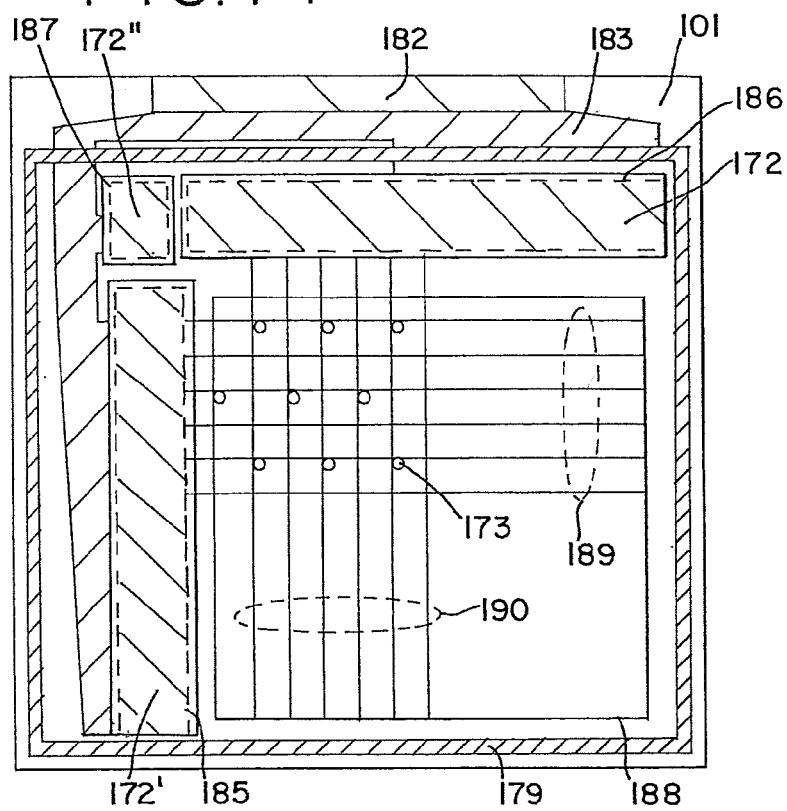
FIG. 14 is a top view useful for explaining the arrangement of input/output terminals, wires, circuit arrangement, spacers and sealants of a liquid crystal display device.

FIG. 14 is a top view of the active matrix substrate. It is the top view showing the positional relationship among the pixel unit, the driving circuit portion, the spacer and the sealant. A scanning signal driving circuit 185 and an image signal driving circuit 186 are disposed as the driving circuit round the pixel unit 188. A signal processing circuit 187 such as a CPU, a memory, etc, may be further added. These driving circuits are connected to external input/output terminals 182 by connection lead wires 183. In the pixel unit 188, a group of gate lead wires 189 extending from the scanning signal driving circuit 185 and a group of source lead wires 190 extending from the image signal driving circuit 186 cross one another in the matrix form. A pixel TFT 204 and a holding capacitance 205 are provided to each pixel.

The columnar spacer 173 disposed in the pixel unit may be provided to all the pixels. However, the columnar spacers may be provided to every several or dozens of pixels disposed in matrix. In other words, the proportion of the number of spacers to the total number of pixels constituting the pixel unit may be preferably 20 to 100%. The spacers 172, 172' and 172" provided to the driving circuit portion may be disposed in such a fashion as to cover the entire surface of the driving circuit portion, or may be divided into several segments in match with the positions of the source and drain lead wires of the TFT as shown in FIG. 12.

The sealant 179 is applied outside the pixel unit 188, the scanning signal control circuit 185, the image signal control circuit 186 and other signal processing circuits 187 but inside the external input/output terminals 182.

Figure 15:
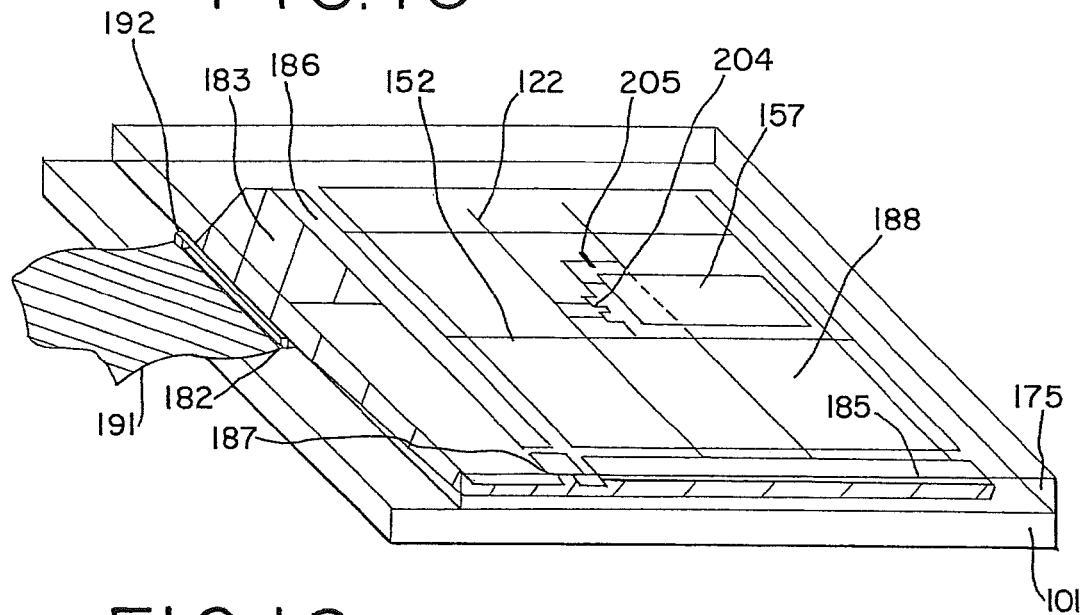
FIG. 15 is a perspective view showing the construction of the liquid crystal display device.

The construction of such an active matrix liquid crystal display device will be explained with reference to the perspective view of FIG. 15. In FIG. 15, the active matrix substrate comprises the pixel unit 188, the scanning signal driving circuit 185, the image signal driving circuit 186 and other signal processing circuit 187 formed on the glass substrate 101. The pixel TFT 204 and the holding capacitance 205 are provided to the pixel unit 188. The driving circuit disposed round the pixel unit comprises the CMOS circuit as the basic circuit. The scanning signal driving circuit 185 and the image signal driving circuit 186 are connected to the pixel TFT 204 by the gate lead wires 122 and the source lead wires 152. A flexible printed circuit (FPC) 191 is connected to the external input terminal 182 and is used for inputting the image signal, and the like. It is connected to the respective driving circuit by connection lead wires 183. The shading film and the transparent electrodes, not shown, are disposed on the opposed substrate 175.

Figure 18:
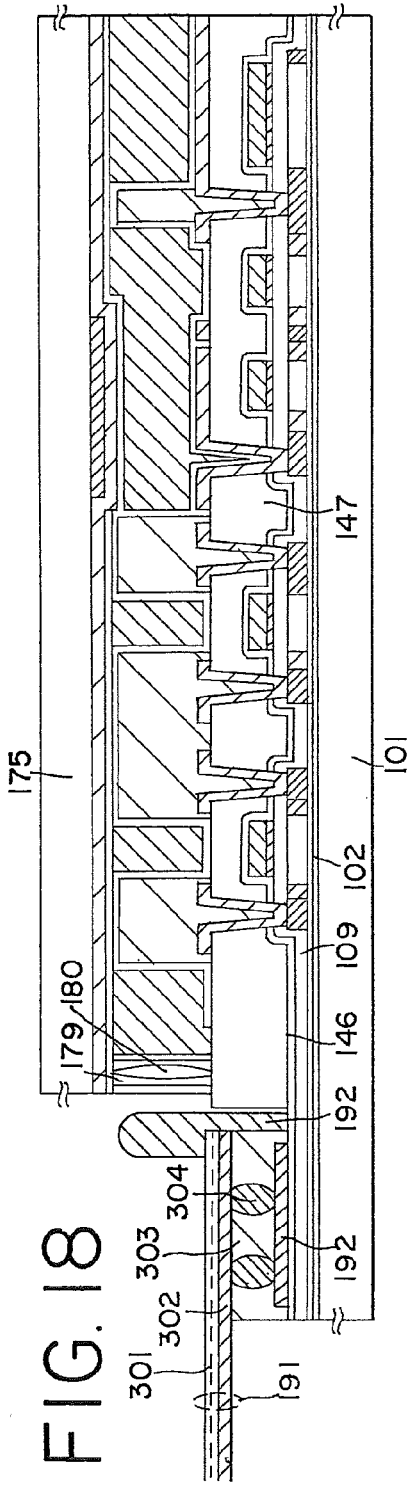
FIG. 18 is an explanatory view useful for explaining the connection structure between a flexible printed board and external input/output terminals.

FIG. 18 is an explanatory view useful for explaining the connection structure between the external input/output terminals 182 and the FPC 191. The external input/output terminal 182 has the same structure as the source lead wire or the drain lead wire, is made of the conductive metal film, and is formed on the substrate 101 from which the inter-layer insulation film 147 is removed. The FPC 191 has a copper lead wire 302 formed on the organic resin film 301 such as polyimide and is connected to the external input/output terminal 182 by an anisotropic conductive adhesive 303. This adhesive 303 comprises an anisotropic adhesive 303 and particles 304 that have a diameter of dozens to hundreds of microns, have a conductive surface plated with gold, or the like, and are mixed in the adhesive 303. When the particles 304 come into electric contact with the external input/output terminal 182 and with the copper lead wire 302, the electric contact is established at such portions. The FPC 191 swells out from the external input/output terminals 182 and is bonded so as to improve the bonding strength with the substrate 101. It has a resin layer 192 at its end portion to improve the mechanical strength at this portion.

The connection structure of the external input/output terminals 182 and the FPC 191 is also the same as shown in FIG.

20, and the spacer 199 is provided to the outside of the sealant 179 and clamped between the active matrix substrate and the opposed substrate. In this way, the mechanical strength at this portion can be increased. This construction functions particularly effectively when a part of the opposed substrate is cut off so as to expose the external input/output terminals 182.

The liquid crystal display device having such a construction can be fabricated by using the active matrix substrate explained in Embodiments 1 through 4. When the active matrix substrate of any of Embodiments 1 through 3 is used, a reflection type liquid crystal display device can be obtained. When the active matrix substrate shown in Embodiment 4 is used, a transmission type liquid crystal display device can be obtained.

Embodiment 7

Figure 17:
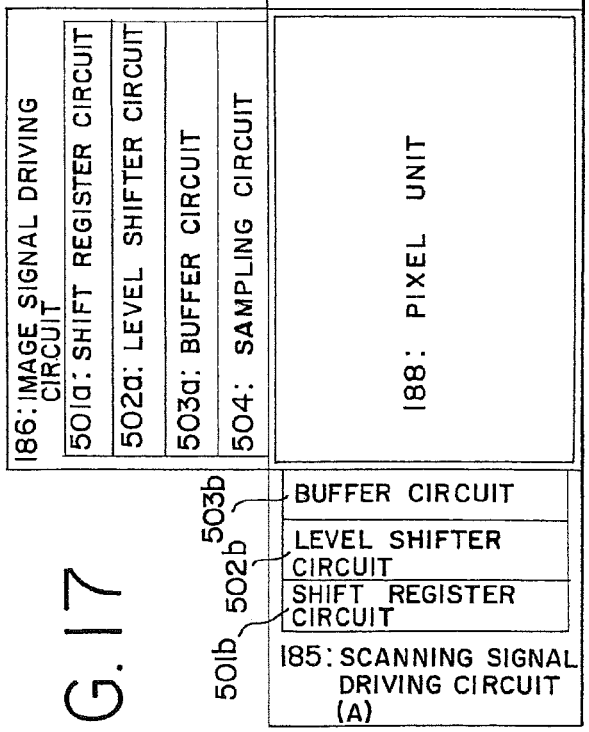
FIG. 17 is a block diagram useful for explaining the circuit construction of the liquid crystal display device.

FIG. 17 shows an example of the circuit construction of the active matrix substrate represented by Embodiments 1 through 4. The drawing shows a circuit construction of a direct viewing type display device. The active matrix substrate includes an image signal driving circuit 186, scanning signal driving circuits (A), (B) 185 and a pixel unit 188. Incidentally, the term "driving circuit" used in this specification is a generic term that includes the image signal driving circuit 186 and the scanning signal driving circuit 185.

The image signal driving circuit 186 includes a shift register circuit 501a, a level shifter circuit 502a, a buffer circuit 503a and a sampling circuit 504. The scanning signal driving circuits (A) (B) 185 include a shift register circuit 501b, a level shifter circuit 502b and a buffer circuit 503b.

Each shift register circuit 501a, 501b uses a driving voltage of 5 to 16 V (typically, 10 V). The TFT constituting the CMOS circuit for forming this circuit includes the first p channel TFT 200 and the first n channel TFT 201 shown in FIG. 3(C). The driving voltages of the level shifter circuits 502a and 502b and the buffer circuits 503a and 503b are as high as 14 to 16 V, but the TFT similar to that of the shift register circuit may be used. The withstand voltage can be improved when these circuits are constituted into the multi-gate structure, and reliability of the circuit can be improved effectively.

A sampling circuit 504 comprises an analog switch and its driving voltage is 14 to 16 V. Since this circuit is driven while its polarity is alternately reversed and moreover, since the OFF current value must be lowered, the sampling circuit 504 preferably comprises the second p channel TFT 202 and second n channel TFT 203 shown in FIG. 3(C). When the OFF current value of the p channel TFT 202 becomes the problem in this circuit, the TFT having the single drain structure having the offset region and fabricated in Embodiment 2 is preferably used.

The driving voltage of the pixel unit is 14 to 16 V. The OFF current value must be further lowered than in the sampling circuit from the aspect of low power consumption. Therefore, the TFT having the multi-gate structure and equipped further with the LDD region, such as the pixel TFT 204 shown in FIG. 3(C), is preferably used.

The construction of this embodiment can be achieved easily by fabricating the TFT in accordance with the process steps shown in Embodiments 1 through 4. Though this embodiment represents only the constructions of the pixel unit and the driving circuit, it is possible to form other circuits such as a signal division circuit, a frequency division circuit, a D/A converter, a γ correction circuit, an operational amplifier circuit, a signal processing circuit such as a memory circuit and an arithmetic processing circuit, or a logic circuit, on the same substrate in accordance with the process steps of Embodiments 1 through 4. As described above, the present invention can accomplish the liquid crystal display device including the pixel unit and the driving circuit on the same substrate, such as the one including the signal controlling circuit and the pixel unit.

Embodiment 8

The active matrix substrate, the liquid crystal display device and the EL display device fabricated in accordance with the present invention can be used for various electro-optical apparatuses. The present invention can be applied to all those electronic apparatuses which include such an electro-optical apparatus as the display medium. Examples of the electronic apparatuses include a personal computer, a digital camera, a video camera, a portable information terminal (a mobile computer, a cellular telephone, an electronic book), and a navigation system. FIG. 22 shows an example of them.

Figure 22A:
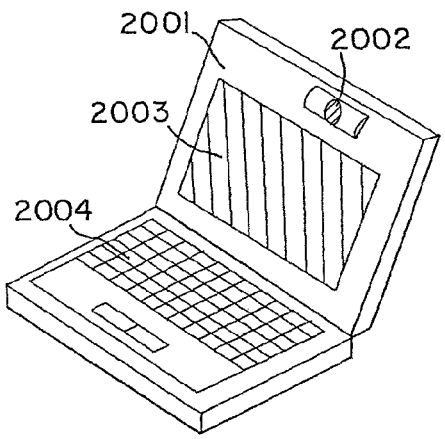
FIGS. 22(A) to 22(F) are schematic views showing examples of the semiconductor devices.

FIG. 22(A) shows the personal computer, which comprises a main body 2001 including a microprocessor and a memory board, an image input unit 2002, a display device 2003 and a keyboard 2004. The present invention can form the display device 2003 and other signal processing circuits.

Figure 22B:
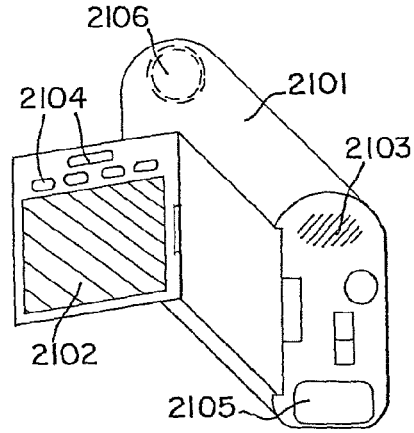

FIG. 22(B) shows a video camera, that comprises a main body 2101, a display device 2102, a sound input unit 2103, an operation switch 2104, a battery 2105 and an image reception unit 2106. The present invention can be applied to the display device 2102 and other signal control circuits.

Figure 22C:
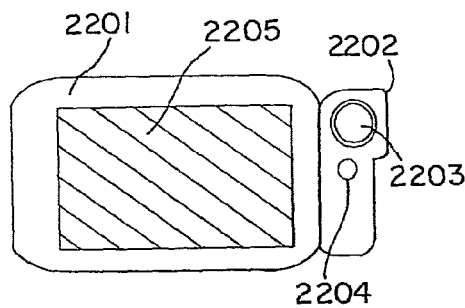

FIG. 22(C) shows the portable information terminal, that comprises a main body 2201, an image input unit 2202, an image reception unit 2203, an operation switch 2204 and a display device 2205. The present invention can be applied to the display device 2205 and other signal controlling circuits.

Figure 21A:
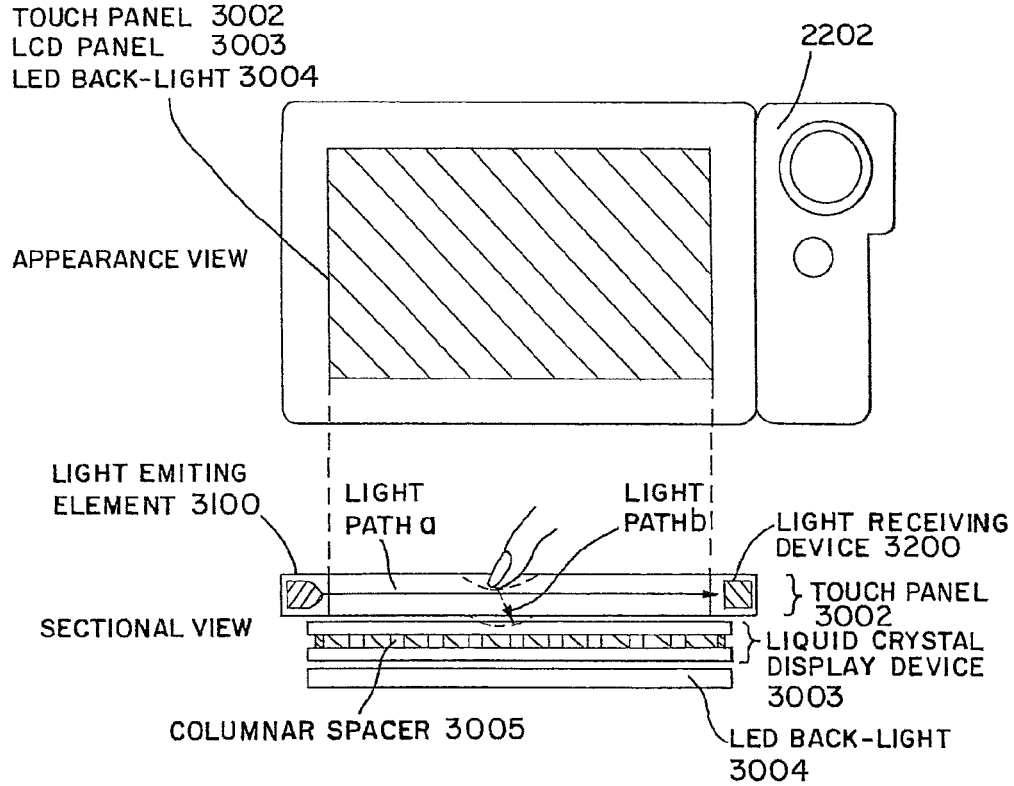
FIG. 21(A) is a schematic view showing an example of semiconductor devices.

Such a portable information terminal is often used indoors as well as outdoors. To operate the terminal for a long time, a reflection type liquid crystal display device utilizing external light is more suitable for the low power consumption type than the type using back-light. However, when the environment is dark, a transmission type liquid crystal display device quipped with back-light is more suitable. Under such circumstances, a hybrid type liquid crystal display device having the features of both reflection type and transmission type has been developed. The present invention can be also applied to such a hybrid type liquid crystal display device. FIG. 21 shows an example of such an application to the portable information terminal. The display device 2205 comprises a touch panel 3002, a liquid crystal display device 3003 and LED back-light 3004. The touch panel 3002 is provided so as to easily operate the portable information terminal. A light emitting element 3100 such as LED is disposed at one of the ends of the touch panel 3002 and a light receiving device 3200 such as a photo-diode is disposed at the other end. An optical path is defined between them. When the touch panel 3002 is pushed and the optical path is cut off, the output of the light receiving element 3200 changes. When these light emitting elements and light receiving elements are disposed in matrix on the liquid crystal display device by utilizing this principle, the touch panel can be allowed to function as the input medium.

Figure 21B:
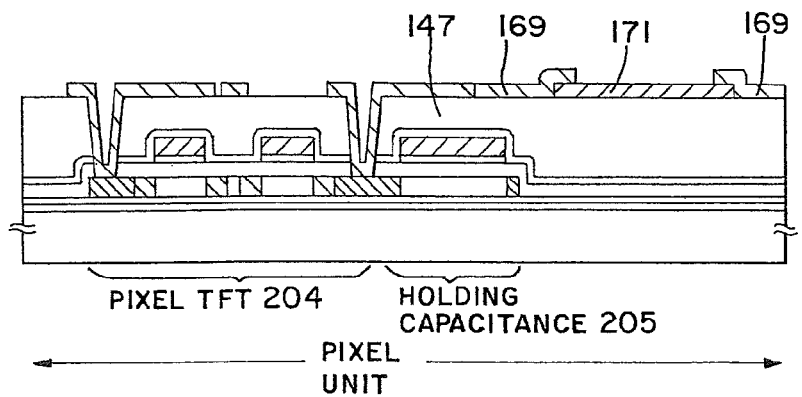
FIG. 21(B) is a sectional view showing a pixel unit of the semiconductor devices.

FIG. 21(B) shows the construction of the pixel unit of the hybrid type liquid crystal display device. A drain electrode 169 and a pixel electrode 171 are disposed on an inter-layer insulation film 147. Such a construction can be achieved by applying Embodiment 4. The drain electrode has a laminate structure of a Ti film and an Al film and operates also as the pixel electrode. The pixel electrode 171 is made of the transparent conductor film material explained in Embodiment 4. As the liquid crystal display device 3003 is fabricated from the active matrix substrate, it can be used suitably for the portable information terminal.

Figure 22D:
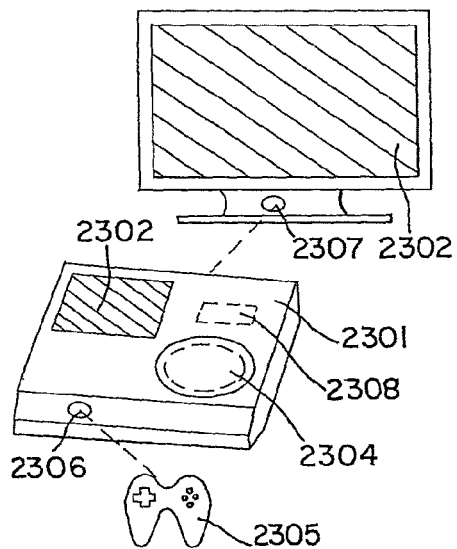

FIG. 22(D) shows an electronic game machine such as a television game or a video game. It comprises a main body 2301 having mounted thereto an electronic circuit 2308 such as a CPU, a recording medium 2304, etc, a controller 2305, a display device 2303 and a display device 2302 that is assembled in the main body 2301. The display device 2303 and the display device 2302 assembled in the main body 2301 may display the same information. Alternatively, the latter may be used mainly as a main display device and the latter, as a sub-display device to display the operation condition of the apparatus or as an operation board by adding the function of a touch sensor. The main body 2301, the controller 2305 and the display device 2303 may have wire communication functions to transmit signals between them, or may be equipped with sensor units 2302 and 2303 for achieving wireless communication or optical communication function. The present invention can be applied to the display devices 2302 and 2303. A conventional CRT may be used for the display device 2303.

FIG. 22(D) shows a player that uses a recording medium storing a program (hereinafter called the "recording medium"). It comprises a main body 2401, a display device 2402, a speaker unit 2403, a recording medium 2404 and an operation switch 2405. Incidentally, a DVD (Digital Versatile Disc) or a compact disk (CD) can be used for the recording medium to reproduce a music program or to display images or information display such as a video game (or a television game) and information display through the Internet. The present invention can be utilized suitably for the display device 2402 and other signal control circuits.

Figure 22E:
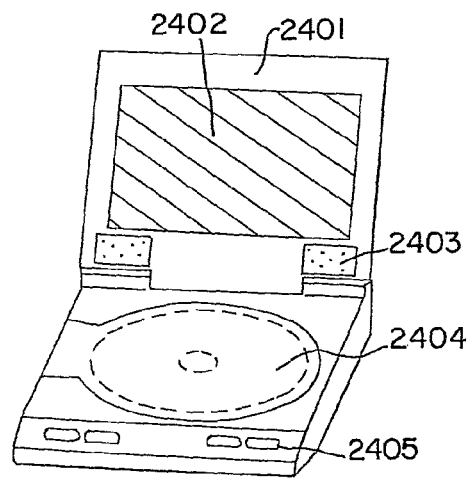
Figure 22F:
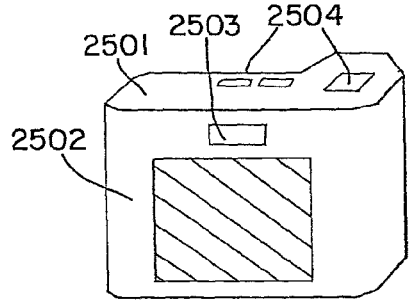

FIG. 22(E) shows a digital camera, which comprises a main body 2501, a display device 2502, an eyepiece unit 2503, an operation switch 2504 and an image reception unit (not shown). The present invention can be applied to the display unit 2502 and other signal control circuits.

Figure 23A:
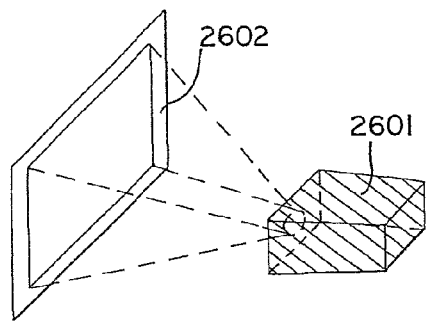
FIGS. 23(A) and 23(B) are schematic views showing the construction of projection type liquid crystal display devices.
Figure 23B:
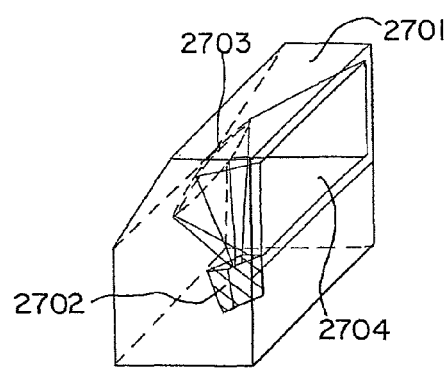

FIG. 23(A) shows a front type projector, which comprises a light source optical system, a display device 2601 and a screen 2602. The present invention can be applied to the display device and other signal control circuits. FIG. 23(B) shows a rear type projector, which comprises a main body 2701, a light source optical system, a display device 2702, a mirror 2703 and a screen 2704. The present invention can be applied to the display device and other signal control circuit.

Figure 23C:
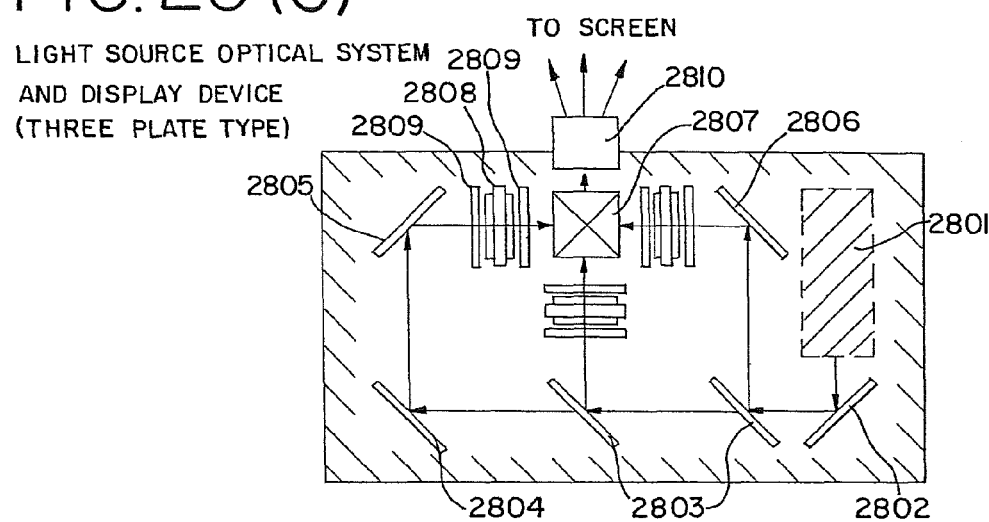
FIG. 23(C) is a schematic view showing a light source optical system and a display device shown in FIGS. 23(A) and 23(B)
Figure 23D:
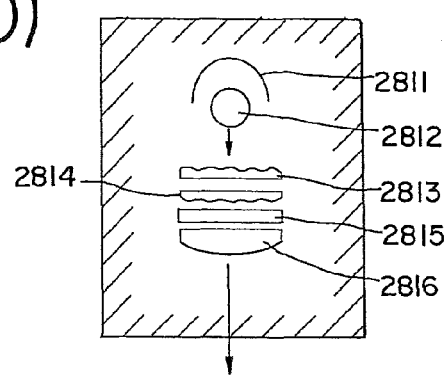
FIG. 23(D) is a schematic view showing a light source optical system shown in FIG. 23(C).

Incidentally, FIG. 23(C) shows an example of the construction of the light source optical system and the display devices 2601 and 2702 in FIGS. 23(A) and 23(B). The light source optical system and the display device 2601 and 2702 comprise a light source optical system 2801, mirrors 2802, 2804 to 2806, a dichroic mirror 2803, a beam splitter 2807, a liquid crystal display device 2808, a phase difference plate 2809 and a projection optical system 2810. The projection optical system 2810 comprises a plurality of optical lenses. FIG. 23(C) shows an example of the three-plate system that uses three liquid crystal display devices 2808. However, the present invention is not limited to such a system, but may be applied to a single-plate optical system. Optical lenses, a film having a polarization function, a film for adjusting the phase, an IR film, etc, may be inserted appropriately in the optical path indicated by an arrow in FIG. 23(C). FIG. 23(D) shows a structural example of the light source optical system 2801 in FIG. 23(C). In this embodiment, the light source optical system 2801 comprises a reflector 2811, a light source 2812, lens arrays 2813 and 2814, a polarization conversion element 2815 and a convergent lens 2816. Incidentally, the light source optical system shown in FIG. 23(D) is an example but is in no way restrictive.

The present invention can be applied to a navigation system of a read circuit of an image sensor, though they are not shown in the drawings. The application range of the present invention is thus extremely broad, and the present invention can be applied to electronic appliances of all fields. The electronic appliances of this embodiment can be accomplished by the technologies of Embodiments 1 through 7.

When the present invention is employed, the TFTs having suitable performance can be arranged in accordance with the specification required by each functional circuit in the semiconductor devices (concretely, the electro-optical devices) having a plurality of functional circuits formed on the same substrate. Moreover, the operation characteristics of such TFTs can be drastically improved.

According to the fabrication method of the semiconductor device of the present invention, the active matrix substrate, in which the p channel TFT of the driving circuit has the single drain structure and the n channel TFT has the LDD structure and the pixel TFT of the pixel unit has the LDD structure, can be fabricated by using six photo-masks. A reflection type liquid crystal display device can be fabricated from such an active matrix substrate. A transmission type liquid crystal display device can be fabricated in accordance with the same process steps by using seven photo-masks.

According to the fabrication method of the semiconductor device of the present invention, an active matrix substrate, in which the p channel TFT of the driving circuit has the single drain structure having the offset region and its n channel TFT has the LDD structure and pixel TFT of the pixel unit has the LDD structure, can be fabricated by using seven photo-masks. The reflection type liquid crystal device can be fabricated from such an active matrix substrate. A transmission type liquid crystal display device can be fabricated in accordance with the same process steps by using eight photo-masks.

In the TFT the gate electrode of which is made of the heat-resistant conductive material and the gate lead wire of which is made of the low resistance conductive material, the fabrication method of the semiconductor device according to the present invention can form the active material substrate in which the p channel TFT of the driving circuit to the single drain structure, its n channel TFT, to the LDD structure, the pixel TFT of the pixel unit to the LDD structure, by using seven photo-masks. The reflection type liquid crystal display device can be fabricated from such an active matrix substrate. The transmission type liquid crystal display device can be fabricated in accordance with the same process steps by using eight photo-masks.

As described above, the number of photo-masks necessary for fabricating the active matrix substrate is limited to 6 to 8. In consequence, the fabrication process can be simplified, and the production cost can be drastically reduced.

What is claimed is:

1. A semiconductor device comprising:
   a first substrate;
   a second substrate facing to the first substrate;
   a shading film comprising Ti, Cr, or Al over the second substrate, the shading film being located between the first substrate and the second substrate;
   a first transistor over the first substrate;
   a second transistor over the first substrate;
   a first spacer overlapping with a semiconductor layer of the first transistor;
   a second spacer a size of which is different with a size of the first spacer; the second spacer overlapping with a semiconductor layer of the second transistor;

wherein the first spacer and the second spacer comprise a same resin.

2. The semiconductor device according to claim 1,
wherein the first transistor is included in a driving circuit, and
wherein the second transistor is included in a pixel unit.

3. The semiconductor device according to claim 2,
wherein the second transistor has a LDD structure.

4. The semiconductor device according to claim 1,
wherein the first spacer does not overlap with a channel formation region of the first transistor.

5. The semiconductor device according to claim 1,
wherein the first spacer is a columnar spacer.

6. The semiconductor device according to claim 1, further comprising a source or drain lead wire electrically connected to the first transistor,
wherein the first spacer covers the source or drain lead wire.

7. The semiconductor device according to claim 1,
wherein the first spacer and the second spacer are formed from a same layer.

8. The semiconductor device according to claim 1,
wherein the first spacer is formed on an entire surface of the first transistor of a driving circuit.

9. The semiconductor device according to claim 1,
wherein the first transistor is one of a p channel type TFT and a n channel type TFT.

10. A semiconductor device comprising:
a first substrate;
a second substrate facing to the first substrate;
a shading film comprising Ti, Cr, or Al, the shading film being located between the first substrate and the second substrate;
a first transistor over the first substrate;
a second transistor over the first substrate;
an insulating layer over the first transistor and the second transistor; the insulating layer include a contact hole;
a source or drain lead wire over the insulating layer, the source or drain lead wire electrically connected to a source or drain region of the first transistor through the contact hole;
a first spacer overlapping with a semiconductor layer of the first transistor; and
a second spacer a size of which is different with a size of the first spacer; the second spacer overlapping with a semiconductor layer of the second transistor in the contact hole.

11. The semiconductor device according to claim 10,
wherein the shading film is provided over the second substrate.

12. The semiconductor device according to claim 10,
wherein the first transistor is included in a driving circuit, and
wherein the second transistor is included in a pixel unit.

13. The semiconductor device according to claim 12,
wherein the second transistor has a LDD structure.

14. The semiconductor device according to claim 10,
wherein the first spacer does not overlap with a channel formation region of the first transistor.

15. The semiconductor device according to claim 10,
wherein the first spacer is a columnar spacer.

16. The semiconductor device according to claim 10,
wherein the first spacer covers the source or drain lead wire.

17. The semiconductor device according to claim 10,
wherein the first spacer and the second spacer are formed from a same layer.

18. The semiconductor device according to claim 10,
wherein the first spacer is formed on an entire surface of the first transistor of a driving circuit.

19. The semiconductor device according to claim 10,
wherein the first transistor is one of a p channel type TFT and a n channel type TFT.

* * * * *